United States Patent
Hirayama et al.

(10) Patent No.: US 11,980,092 B2
(45) Date of Patent: May 7, 2024

(54) ORGANIC ELECTROLUMINESCENCE ELEMENT

(71) Applicants: HODOGAYA CHEMICAL CO., LTD., Tokyo (JP); SFC CO., LTD., Cheongju-si (KR)

(72) Inventors: Yuta Hirayama, Tokyo (JP); Shunji Mochizuki, Tokyo (JP); Takeshi Yamamoto, Tokyo (JP); Shuichi Hayashi, Tokyo (JP); Young-hwan Park, Cheongju-si (KR)

(73) Assignees: HODOGAYA CHEMICAL CO., LTD., Tokyo (JP); SFC CO., LTD., Cheongju-Si (KR)

( * ) Notice: Subject to any disclaimer, the term of this patent is extended or adjusted under 35 U.S.C. 154(b) by 414 days.

(21) Appl. No.: 17/431,195

(22) PCT Filed: Feb. 28, 2020

(86) PCT No.: PCT/JP2020/008306
§ 371 (c)(1),
(2) Date: Aug. 16, 2021

(87) PCT Pub. No.: WO2020/184219
PCT Pub. Date: Sep. 17, 2020

(65) Prior Publication Data
US 2022/0149291 A1    May 12, 2022

(30) Foreign Application Priority Data
Mar. 11, 2019  (JP) .................. 2019-044170

(51) Int. Cl.
*H10K 85/60*   (2023.01)
*H10K 50/844*  (2023.01)
*H10K 50/858*  (2023.01)

(52) U.S. Cl.
CPC ....... *H10K 85/6572* (2023.02); *H10K 50/858* (2023.02); *H10K 85/626* (2023.02);
(Continued)

(58) Field of Classification Search
CPC .................. H10K 50/844; H10K 50/858
See application file for complete search history.

(56) References Cited

U.S. PATENT DOCUMENTS 5,639,914 A   6/1997  Tomiyama et al.
5,792,557 A   8/1998  Nakaya et al.
(Continued)

FOREIGN PATENT DOCUMENTS

CN   107674060 A   2/2018
CN   109400485 A   3/2019
(Continued)

OTHER PUBLICATIONS

Dyall et al., "Oxidative Cyclizations. VIII* Mechanisms of Oxidation of ortho-Substituted Benzenamines and Improved Cyclizations by Bis(acetato-O)phenyliodine", Aust. J. Chem., 1992, vol. 45, p. 371-384, total 15 pages.
(Continued)

*Primary Examiner* — Daniel P Shook
(74) *Attorney, Agent, or Firm* — Birch, Stewart, Kolasch & Birch, LLP

(57) ABSTRACT

It is an object of the present invention to provide an organic EL element including a capping layer constituted by two layers consisting of a first capping layer and a second capping layer that has a refractive index that is higher than that of the first capping layer, in order to improve the light extraction efficiency compared with an organic EL element including a capping layer constituted by a single layer. The present invention provides an organic electroluminescent element at least including an anode, a hole transport layer, a (Continued)

light emitting layer, an electron transport layer, a cathode, and a capping layer arranged in this order, wherein the capping layer has a structure constituted by two layers consisting of a first capping layer and a second capping layer, a refractive index of the second capping layer is higher than a refractive index of the first capping layer throughout a wavelength range from 450 to 650 nm, and the second capping layer contains an arylamine compound having a specific structure.

14 Claims, 1 Drawing Sheet

(52) U.S. Cl.
CPC ......... *H10K 85/633* (2023.02); *H10K 85/636* (2023.02); *H10K 85/655* (2023.02); *H10K 85/6574* (2023.02); *H10K 50/844* (2023.02)

(56) References Cited

U.S. PATENT DOCUMENTS

| | | | |
|---|---|---|---|
| 2016/0155979 A1* | 6/2016 | Yim | H10K 50/858 257/40 |
| 2018/0294416 A1 | 10/2018 | Hayashi et al. | |
| 2020/0328353 A1* | 10/2020 | Yokoyama | H10K 85/636 |

FOREIGN PATENT DOCUMENTS

| | | |
|---|---|---|
| CN | 109400520 A | 3/2019 |
| JP | 2015-92485 A | 5/2015 |
| TW | 201726889 A1 | 8/2017 |
| WO | WO 2015/001726 A1 | 1/2015 |
| WO | WO 2017/183625 A1 | 10/2017 |
| WO | WO2017183625 A1 * 10/2017 ............. H10K 50/00 |

OTHER PUBLICATIONS

Endo et al., "Efficient up-conversion of triplet excitons into a singlet state and its application for organic light emitting diodes", Applied Physics Letters, (2011), vol. 98, 083302, total 3 pages.

Hosokawa et al., "Development of Styryl-Based Light Emitting Material", Proceedings of the 9th Meeting of the Japan Society of Applied Physics, (2001), p. 55-61, total 8 pages.

Hung et al., "Application of an ultrathin LiF/Al bilayer in organic surface-emitting diodes", Applied Physics Letters, vol. 78, No. 4, Jan. 22, 2001, p. 544-546, total 2 pages.

International Search Report, issued in PCT/JP2020/008306, PCT/ISA/210, dated May 26, 2020.

Ishiyama et al., "Palladium(O)-Catalyzed Cross-Coupling Reaction of Alkoxydiboron with Haloarenes: A Direct Procedure for Arylboronic Esters", J. Org. Chem., 1995, vol. 60, p. 7508-7510, total 3 pages.

Miyaura et al., "The Palladium-Catalyzed Cross-Coupling Reaction of Phenylboronic Acid with Haloarenes in the Presence of Bases", Synthetic Communications, (1981), vol. 11, No. 7, p. 513-519, total 7 pages.

Riel et al., "Phosphorescent top-emitting organic light-emitting devices with improved light outcoupling", Applied Physics Letters, vol. 82, No. 3, Jan. 20, 2003, p. 466-468, total 4 pages.

\* cited by examiner

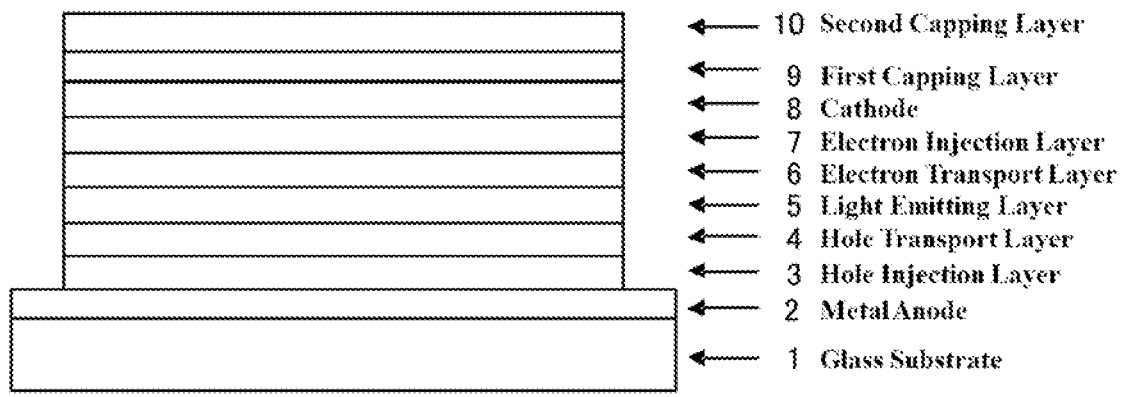

ORGANIC ELECTROLUMINESCENCE ELEMENT

TECHNICAL FIELD

The present invention relates to an organic electroluminescent element (hereinafter referred to simply as an "organic EL element"), which is a self-light-emitting element favorably used in various display devices, particularly relates to an organic EL element in which capping layers are stacked, and more particularly relates to an organic EL element having an improved efficiency.

BACKGROUND ART

Since organic EL elements are self-emissive elements, they are brighter than liquid crystal elements, have superior display viewability, and can provide a clearer display. For these reasons, active studies have been carried out on organic EL elements.

In 1987, C. W. Tang et al. of Eastman Kodak Company made a practical organic EL element in which an organic material was used, by developing an element having a stacked layer structure in which various functions were assigned to different materials. They achieved a high luminance of 1,000 cd/m$^2$ or higher at a voltage of 10 V or less by stacking a layer of a fluorescent body capable of transporting electrons and a layer of an organic substance capable of transporting holes, injecting both charges into the fluorescent body layer, and thereby causing the layer to emit light (see Patent Literatures 1 and 2, for example).

Many improvements have been heretofore made to organic EL elements to put them to practical use. High efficiency and durability have been achieved by electroluminescent elements with a bottom emission structure in which light is extracted from the bottom, the electroluminescent elements being elements in which various functions of the stacked layer structure are subdivided even further, and an anode, a hole injection layer, a hole transport layer, a light emitting layer, an electron transport layer, an electron injection layer, and a cathode are sequentially provided on a substrate (see Non-Patent Literature 1, for example).

Recently, light emitting elements with a top emission structure in which a metal having a high work function is used for an anode and light is emitted from the top are coming into use. Contrary to light emitting elements with a bottom emission structure in which the area from which light is extracted is limited by a pixel circuit, light emitting elements with a top emission structure are advantageous in that a large area from which light is extracted can be secured. In light emitting elements with a top emission structure, translucent electrodes made of LiF/Al/Ag (see Non-Patent Literature 2, for example), Ca/Mg (see Non-Patent Literature 3, for example), LiF/MgAg, or the like are used for a cathode.

In such light emitting elements, when light that is emitted by a light emitting layer and incident on another layer is incident at a certain angle or more, the light is totally reflected at an interface between the light emitting layer and the other layer. Thus, light that can be used has been limited to only a part of the emitted light. Recently, light emitting elements have been proposed in which a "capping layer" with a high refractive index is provided on the outside of a translucent electrode with a low refractive index, in order to improve the light extraction efficiency (see Non-Patent Literatures 2 and 3, for example).

Regarding the effect of the capping layer in light emitting elements with a top emission structure, while a light emitting element using Ir(ppy)$_3$ as a light emitting material has a current efficiency of 38 cd/A in the case of not having a capping layer, the light emitting element has a current efficiency of 64 cd/A in the case of using a ZnSe film with a thickness of 60 nm as a capping layer, which indicates that the efficiency is improved about 1.7 times. Furthermore, it is indicated that a maximum point of the transmittance and a maximum point of the efficiency of the translucent electrode and the capping layer do not absolutely match each other, and the maximum point of the light extraction efficiency is determined by interference effects (see Non-Patent Literature 3, for example).

It has been proposed to use a fine metal mask to form a capping layer, but this configuration is problematic in that thermal deformation occurs when used at a high temperature, which deteriorates the positioning precision. For example, ZnSe has a high melting point of 1100° C. or higher (see Non-Patent Literature 3, for example), and thus vapor deposition cannot be performed at an accurate position with a fine metal mask, and many other inorganic materials also have a high vapor deposition temperature and use of a fine metal mask is not suitable therefor for the same reason. Moreover, this also may damage the light emitting element itself. Furthermore, film forming through sputtering damages the light emitting element, and thus a capping layer using an inorganic material as a constituent material cannot be suitably used.

It has been proposed to use tris(8-hydroxyquinoline) aluminum (hereinafter referred to simply as "Alq$_3$") for a capping layer for adjusting the refractive index (see Non-Patent Literature 2, for example). Alq$_3$ is known as an organic EL material that is commonly used as a green light emitting material or electron transport material, and is poor in absorption at around 450 nm, which is for blue light emitting elements.

Accordingly, when it is used for blue light emitting elements, there is a problem in that both the color purity and the light extraction efficiency deteriorate.

CITATION LIST

Patent Literature

Patent Literature 1: U.S. Pat. No. 5,792,557
Patent Literature 2: U.S. Pat. No. 5,639,914
Patent Literature 3: WO 2015-001726

Non-Patent Literature

Non-Patent Literature 1: Proceedings of the 9th Meeting of the Japan Society of Applied Physics, pp. 55-61 (2001)
Non-Patent Literature 2: Appl. Phys. Lett., 78, 544 (2001)
Non-Patent Literature 3: Appl. Phys. Lett., 82, 466 (2003)
Non-Patent Literature 4: Aust. J. Chem., 45, 371 (1992)
Non-Patent Literature 5: J. Org. Chem., 60, 7508 (1995)
Non-Patent Literature 6: Synth. Commun., 11, 513 (1981)
Non-Patent Literature 7: Appl. Phys. Let., 98, 083302 (2011)

SUMMARY OF INVENTION

It is an object of the present invention to provide an organic EL element including a capping layer constituted by two layers consisting of a first capping layer that has a high refractive index, and excellent stability, durability, and light resistance, and a second capping layer that has a refractive index that is higher than that of the first capping layer, and has excellent stability, durability, and light resistance, in order to improve the light extraction efficiency of an organic EL element.

A material for a second capping layer suitable for the present invention should have the following physical properties: (1) vapor-depositability and non-thermally-decomposability, (2) good stability in a thin film state, (3) a high glass transition point, and (4) a high refractive index. Also, an element suitable for the present invention should have the following physical properties: (1) high light extraction efficiency, (2) no deterioration in the color purity, (3) light transmittability without change over time, and (4) a long life.

To achieve the above-described objects, the inventors of the present invention focused on the fact that arylamine-based materials have excellent stability in a thin film state and durability, selected specific arylamine compounds having a high refractive index, produced organic EL elements using the compounds as a constituent material for the second capping layer, and thoroughly evaluated the properties thereof, as a result of which the present invention was accomplished.

According to the present invention, the following organic EL element is provided.

1) An organic electroluminescent element at least comprising an anode, a hole transport layer, a light emitting layer, an electron transport layer, a cathode, and a capping layer arranged in this order, wherein the capping layer has a structure constituted by two layers consisting of a first capping layer and a second capping layer that are arranged in this order from the cathode side, a refractive index of the second capping layer is higher than a refractive index of the first capping layer throughout a wavelength range from 450 to 650 nm, and the second capping layer contains an arylamine compound represented by the general formula (1) as below:

[Chem. 1]

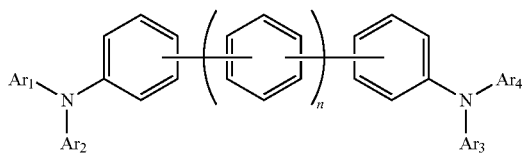

(1)

where $Ar_1$, $Ar_2$, $Ar_3$, and $Ar_4$ are optionally the same or different, and represent a substituted or unsubstituted aromatic hydrocarbon group, a substituted or unsubstituted aromatic heterocyclic group, or a substituted or unsubstituted fused polycyclic aromatic group, at least one of $Ar_1$, $Ar_2$, $Ar_3$, and $Ar_4$ is a monovalent group represented by the structural formula (B) as below, or a group substituted with the monovalent group represented by the structural formula (B), and n represents an integer of 0 to 4:

[Chem. 2]

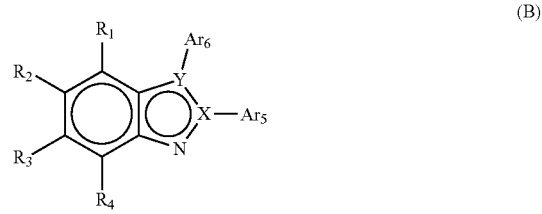

(B)

where $R_1$, $R_2$, $R_3$, and $R_4$ are optionally the same or different, and represent a hydrogen atom, a heavy hydrogen atom, a fluorine atom, a chlorine atom, a cyano group, a nitro group, a silyl group, a linear or branched alkyl group having 1 to 6 carbon atoms and optionally having a substituent, a cycloalkyl group having 5 to 10 carbon atoms and optionally having a substituent, a linear or branched alkenyl group having 2 to 6 carbon atoms and optionally having a substituent, a linear or branched alkyloxy group having 1 to 6 carbon atoms and optionally having a substituent, a cycloalkyloxy group having 5 to 10 carbon atoms and optionally having a substituent, a substituted or unsubstituted aromatic hydrocarbon group, a substituted or unsubstituted aromatic heterocyclic group, a substituted or unsubstituted fused polycyclic aromatic group, or a substituted or unsubstituted aryloxy group, $R_1$, $R_2$, $R_3$, and $R_4$ are optionally bonded to each other to form a ring via a single bond, a substituted or unsubstituted methylene group, a substituted or unsubstituted amino group, an oxygen atom, or a sulfur atom, $Ar_5$ and $Ar_6$ are optionally the same or different, and represent a substituted or unsubstituted aromatic hydrocarbon group, a substituted or unsubstituted aromatic heterocyclic group, or a substituted or unsubstituted fused polycyclic aromatic group, at least one of $R_1$, $R_2$, $R_3$, $R_4$, $Ar_5$, and $Ar_6$ is a linking group as a binding site, X represents a carbon atom or a nitrogen atom, Y represents a carbon atom, a nitrogen atom, an oxygen atom, or a sulfur atom, in a case in which Y is an oxygen atom or a sulfur atom, Y has no $Ar_6$, in a case in which X and Y are a nitrogen atom, X or Y has no $Ar_5$ nor $Ar_6$, in a case in which X is a nitrogen atom and Y is a carbon atom, X or Y has no $Ar_5$ nor $Ar_6$, and there is no case in which X and Y are a carbon atom, no case in which X is a nitrogen atom and Y is an oxygen atom, and no case in which X is a nitrogen atom and Y is a sulfur atom.

2) The organic EL element as set forth in 1) above, wherein the structural formula (B) above is a monovalent group represented by the structural formula (B-1) as below:

[Chem. 3]

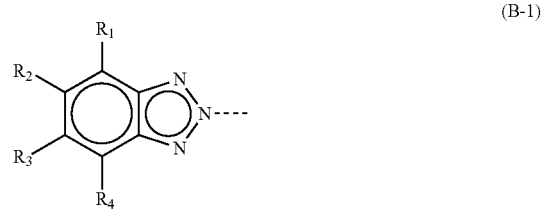

(B-1)

where $R_1$, $R_2$, $R_3$, and $R_4$ are optionally the same or different, and represent a hydrogen atom, a heavy hydrogen atom, a fluorine atom, a chlorine atom, a cyano group, a nitro group, a silyl group, a linear or branched alkyl group having 1 to 6 carbon atoms and optionally having a substituent, a cycloalkyl group having 5 to 10 carbon atoms and optionally having a substituent, a linear or branched alkenyl group having 2 to 6 carbon atoms and optionally having a substituent, a linear or branched alkyloxy group having 1 to 6 carbon atoms and optionally having a substituent, a cycloalkyloxy group having 5 to 10 carbon atoms and optionally having a substituent, a substituted or unsubstituted aromatic hydrocarbon group, a substituted or unsubstituted aromatic heterocyclic group, a substituted or unsubstituted fused polycyclic aromatic group, or a substituted or unsubstituted aryloxy group, $R_1$, $R_2$, $R_3$, and $R_4$ are optionally bonded to each other to form a ring via a single bond, a substituted or unsubstituted methylene group, a substituted or unsubstituted amino group, an oxygen atom, or a sulfur atom, and the broken line portion indicates a binding site.

3) The organic EL element as set forth in 1) above, wherein the structural formula (B) above is a monovalent group represented by the structural formula (B-2) as below:

[Chem. 4]

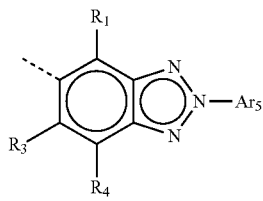

(B-2)

where $R_1$, $R_3$, and $R_4$ are the same as $R_1$, $R_3$, and $R_4$ in the general formula (B-1) above, $R_3$ and $R_4$ are optionally bonded to each other to form a ring via a single bond, a substituted or unsubstituted methylene group, a substituted or unsubstituted amino group, an oxygen atom, or a sulfur atom, $Ar_5$ represents a substituted or unsubstituted aromatic hydrocarbon group, a substituted or unsubstituted aromatic heterocyclic group, or a substituted or unsubstituted fused polycyclic aromatic group, and the broken line portion indicates a binding site.

4) The organic EL element as set forth in 1) above, wherein the structural formula (B) above is a monovalent group represented by the structural formula (B-3) as below:

[Chem. 5]

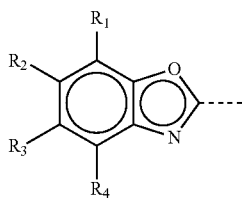

(B-3)

where $R_1$, $R_2$, $R_3$, and $R_4$ are the same as $R_1$, $R_2$, $R_3$, and $R_4$ in the general formula (B-1) above, and the broken line portion indicates a binding site.

5) The organic EL element as set forth in 1) above, wherein the structural formula (B) above is a monovalent group represented by the structural formula (B-4) as below:

[Chem. 6]

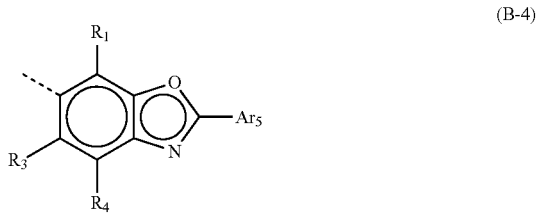

(B-4)

where $R_1$, $R_3$, and $R_4$ are the same as $R_1$, $R_3$, and $R_4$ in the general formula (B-1) above, $R_3$ and $R_4$ are optionally bonded to the same substituted benzene ring to form a ring via a single bond, a substituted or unsubstituted methylene group, a substituted or unsubstituted amino group, an oxygen atom, or a sulfur atom, $Ar_5$ represents a substituted or unsubstituted aromatic hydrocarbon group, a substituted or unsubstituted aromatic heterocyclic group, or a substituted or unsubstituted fused polycyclic aromatic group, and the broken line portion indicates a binding site.

6) The organic EL element as set forth in 1) above, wherein the structural formula (B) above is a monovalent group represented by the structural formula (B-5) as below:

[Chem. 7]

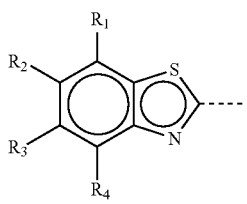

(B-5)

where $R_1$, $R_2$, $R_3$, and $R_4$ are the same as $R_1$, $R_2$, $R_3$, and $R_4$ in the general formula (B-1) above, and the broken line portion indicates a binding site.

7) The organic EL element as set forth in 1) above, wherein the structural formula (B) above is a monovalent group represented by the structural formula (B') as below:

[Chem. 8]

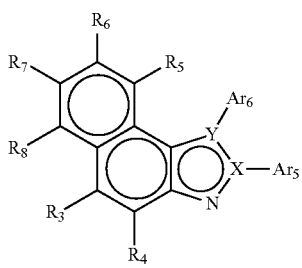

(B')

where $R_3$, $R_4$, $R_5$, $R_6$, $R_7$, and $R_8$ are optionally the same or different, and represent a hydrogen atom, a heavy hydrogen atom, a fluorine atom, a chlorine atom, a cyano group, a nitro group, a silyl group, a linear or branched alkyl group having 1 to 6 carbon atoms and optionally having a substituent, a cycloalkyl group having 5 to 10 carbon atoms and optionally having a substituent, a linear or branched alkenyl group having 2 to 6 carbon atoms and optionally having a substituent, a linear or branched alkyloxy group having 1 to 6 carbon atoms and optionally having a substituent, a cycloalkyloxy group having 5 to 10 carbon atoms and optionally having a substituent, a substituted or unsubstituted aromatic hydrocarbon group, a substituted or unsubstituted aromatic heterocyclic group, a substituted or unsubstituted fused polycyclic aromatic group, or a substituted or unsubstituted aryloxy group, $R_3$, $R_4$, $R_5$, $R_6$, $R_7$, and $R_8$ are optionally bonded to each other to form a ring via a single bond, a substituted or unsubstituted methylene group, a substituted or unsubstituted amino group, an oxygen atom, or a sulfur atom, $Ar_5$ and $Ar_6$ are optionally the same or different, and represent a substituted or unsubstituted aromatic hydrocarbon group, a substituted or unsubstituted aromatic heterocyclic group, or a substituted or unsubstituted fused polycyclic aromatic group, at least one of $R_3$, $R_4$, $R_5$, $R_6$, $R_7$, $R_8$, $Ar_5$, and $Ar_6$ is a linking group as a binding site, X represents a carbon atom or a nitrogen atom, Y represents a carbon atom, a nitrogen atom, an oxygen atom, or a sulfur atom, in a case in which Y is an oxygen atom or a sulfur atom, Y has no $Ar_6$, in a case in which X and Y are a nitrogen atom, X or Y has no $Ar_5$ nor $Ar_6$, and there is no case in which X and Y are a carbon atom, no case in which X is a nitrogen atom and Y is an oxygen atom, and no case in which X is a nitrogen atom and Y is a sulfur atom.

8) The organic EL element as set forth in any one of 1) to 7) above, wherein n is 0 in the general formula (1) above.

9) The organic EL element as set forth in any one of 1) to 7) above, wherein n is 1 in the general formula (1) above.

10) The organic EL element as set forth in any one of 1) to 7) above, wherein n is 2 in the general formula (1) above.

11) The organic EL element as set forth in any one of 1) to 10), wherein any two of $Ar_1$, $Ar_2$, $Ar_3$, and $Ar_4$ in the general formula (1) above are a monovalent group represented by the structural formula (B) above, or a group substituted with the monovalent group represented by the structural formula (B).

12) The organic EL element as set forth in any one of 1) to 10), wherein $Ar_1$ and $Ar_4$ in the general formula (1) above are a monovalent group represented by the structural formula (B) above, or a group substituted with the monovalent group represented by the structural formula (B).

13) The organic electroluminescent element as set forth in any one of 1) to 12), wherein a refractive index ($n_2$) of the electron transport layer and a refractive index ($n_1$) of the first capping layer satisfy the general formula (I) as below throughout a wavelength range from 450 to 550 nm:

$$0.005 \leq n_1 - n_2 \leq 0.15 \quad \text{(I)}$$

14) The organic EL element as set forth in any one of 1) to 13), wherein the total thickness of the first capping layer and the second capping layer is from 30 to 120 nm.

15) The organic EL element as set forth in any one of 1) to 14), wherein a refractive index of the second capping layer is 1.85 or more throughout a wavelength range from 450 to 750 nm.

The organic EL element of the present invention has a capping layer having a stacked structure of a first capping layer and a second capping layer that are provided on the outside of a transparent or translucent electrode, and that have a refractive index that is higher than that of the electrode, and thus the light extraction efficiency is significantly improved. Furthermore, an arylamine compound represented by the general formula (1) above is used for the second capping layer, which makes it possible to perform film forming at a temperature of 400° C. or lower, and thus the light emitting element is not damaged, and the light extraction efficiency of each color can be optimized using a fine mask. Thus, the element can be suitably used for full color display, and can present a clear and bright image with good color purity.

The organic EL element of the present invention uses, as a material for the second capping layer, an organic EL element material that has a high refractive index, and excellent stability in a thin film state, durability, and light resistance, and thus the color purity can be maintained and the light extraction efficiency can be significantly improved compared with conventional organic EL elements. Accordingly, it is possible to realize an organic EL element that has high efficiency and a long lifespan.

BRIEF DESCRIPTION OF DRAWINGS

FIG. 1 shows the structures of organic EL elements of Examples 10 to 15 and Comparative Examples 1 to 3.

DESCRIPTION OF EMBODIMENTS

Specific examples of the "aromatic hydrocarbon group", the "aromatic heterocyclic group", or the "fused polycyclic aromatic group" of the "substituted or unsubstituted aromatic hydrocarbon group", the "substituted or unsubstituted aromatic heterocyclic group", or the "substituted or unsubstituted fused polycyclic aromatic group" represented by $Ar_1$, $Ar_2$, $Ar_3$, and $Ar_4$ in the general formula (1) include a phenyl group, a biphenylyl group, a terphenylyl group, a naphthyl group, an anthryl group, a phenanthryl group, a fluorenyl group, an indenyl group, a pyrenyl group, a perylenyl group, a fluoranthenyl group, a triphenylenyl group, a pyridyl group, a furyl group, a pyrrolyl group, a thienyl group, a quinolyl group, an isoquinolyl group, a benzofuranyl group, a benzothienyl group, an indolyl group, a carbazolyl group, a benzotriazolyl group, a benzooxazolyl group, a benzothiazolyl group, a quinoxalyl group, a benzimidazolyl group, a pyrazolyl group, a dibenzofuranyl group, a dibenzothienyl group, a spirofluorenyl group, and a carbolinyl group.

Specific examples of the "substituent" of the "substituted aromatic hydrocarbon group", the "substituted aromatic heterocyclic group", or the "substituted fused polycyclic aromatic group" represented by $Ar_1$, $Ar_2$, $Ar_3$, and $Ar_4$ in the general formula (1) include groups such as: a heavy hydrogen atom, a trifluoromethyl group, a cyano group, a nitro group; halogen atoms such as a fluorine atom, a chlorine atom, a bromine atom, and an iodine atom; silyl groups such as a trimethylsilyl group, and a triphenylsilyl group; linear or branched alkyl groups having 1 to 6 carbon atoms such a methyl group, an ethyl group, an n-propyl group, an isopropyl group, an n-butyl group, an isobutyl group, a tert-butyl group, an n-pentyl group, an isopentyl group, a neopentyl group, and an n-hexyl group; linear or branched alkyloxy groups having 1 to 6 carbon atoms such as a methyloxy group, an ethyloxy group, and a propyloxy group; alkenyl groups such as an allyl group; aralkyl groups such as a benzyl group, a naphthylmethyl group, and a phenethyl group; aryloxy groups such as a phenyloxy group and a tolyloxy group; arylalkyloxy groups such as a benzyloxy group and a phenethyloxy group; aromatic hydrocarbon groups or fused polycyclic aromatic groups such as a phenyl group, a biphenylyl group, a terphenylyl group, a naphthyl group, an anthracenyl group, a phenanthryl group, a fluorenyl group, an indenyl group, a pyrenyl group, a perylenyl group, a fluoranthenyl group, a triphenylenyl group, and a spirofluorenyl group; aromatic heterocyclic groups such as a pyridyl group, a furyl group, a thienyl group, a pyrrolyl group, a quinolyl group, an isoquinolyl group, a benzofuranyl group, a benzothienyl group, an indolyl group, a carbazolyl group, a benzotriazolyl group, a benzooxazolyl group, a benzothiazolyl group, a quinoxalyl group, a benzimidazolyl group, a pyrazolyl group, a dibenzofuranyl group, a dibenzothienyl group, and a carbolinyl group; aryl vinyl groups such as a styryl group and a naphthyl vinyl group; acyl groups such as an acetyl group and a benzoyl group; dialkylamino groups such as a dimethylamino group and a diethylamino group; disubstituted amino groups substituted with an aromatic hydrocarbon group or a fused polycyclic aromatic group such as a diphenylamino group or a dinaphthylamino group; diaralkylamino groups such as a dibenzylamino group and a diphenethylamino group; disubstituted amino groups substituted with an aromatic heterocyclic group such as a dipyridylamino group or a dithienylamino group; dialkenylamino groups such as a diallylamino group; and disubstituted amino groups substituted with a substituent selected from the group consisting of an alkyl group, an aromatic hydrocarbon group, a fused polycyclic aromatic group, an aralkyl group, an aromatic heterocyclic group, and an alkenyl group. These substituents may further be substituted with any of the substituents listed above as examples. Furthermore, these substituents are optionally bonded to each other to form a ring via a single bond, a substituted or unsubstituted methylene group, a substituted or unsubstituted amino group, an oxygen atom, or a sulfur atom.

Specific examples of the "linear or branched alkyl group having 1 to 6 carbon atoms", the "cycloalkyl group having 5 to 10 carbon atoms", or the "linear or branched alkenyl group having 2 to 6 carbon atoms" of the "linear or branched alkyl group having 1 to 6 carbon atoms and optionally having a substituent", the "cycloalkyl group having 5 to 10 carbon atoms and optionally having a substituent", or the "linear or branched alkenyl group having 2 to 6 carbon atoms and optionally having a substituent" represented by $R_1$, $R_2$, $R_3$, $R_4$, $R_5$, $R_6$, $R_7$, and $R_8$ in the structural formulae (B), (B-1), (B-2), (B-3), (B-4), (B-5), and (B') include a methyl group, an ethyl group, an n-propyl group, an isopropyl group, an n-butyl group, an isobutyl group, a tert-butyl group, an n-pentyl group, an isopentyl group, a neopentyl group, an n-hexyl group, a cyclopentyl group, a cyclohexyl group, a 1-adamantyl group, a 2-adamantyl group, a vinyl group, an allyl group, an isopropenyl group, a 2-butenyl group, and the like. These groups are optionally bonded to each other to form a ring via a single bond, a substituted or unsubstituted methylene group, a substituted or unsubstituted amino group, an oxygen atom, or a sulfur atom.

The "substituent" of the "linear or branched alkyl group having 1 to 6 carbon atoms and having a substituent", the "cycloalkyl group having 5 to 10 carbon atoms and having a substituent", or the "linear or branched alkenyl group having 2 to 6 carbon atoms and having a substituent" represented by $R_1$, $R_2$, $R_3$, $R_4$, $R_5$, $R_6$, $R_7$, and $R_8$ in the structural formulae (B), (B-1), (B-2), (B-3), (B-4), (B-5), and (B') may be the same as those listed above as examples of the "substituent" of the "substituted aromatic hydrocarbon group", the "substituted aromatic heterocyclic group", or the "substituted fused polycyclic aromatic group" represented by $Ar_1$, $Ar_2$, $Ar_3$, and $Ar_4$ in the general formula (1) above. The same holds true for the forms that these groups can take.

Specific examples of the "linear or branched alkyloxy group having 1 to 6 carbon atoms" or the "cycloalkyloxy group having 5 to 10 carbon atoms" of the "linear or branched alkyloxy group having 1 to 6 carbon atoms and optionally having a substituent" or the "cycloalkyloxy group having 5 to 10 carbon atoms and optionally having a substituent" represented by $R_1$, $R_2$, $R_3$, $R_4$, $R_5$, $R_6$, $R_7$, and $R_8$ in the structural formulae (B), (B-1), (B-2), (B-3), (B-4), (B-5), and (B') include a methyloxy group, an ethyloxy group, an n-propyloxy group, an isopropyloxy group, an n-butyloxy group, a tert-butyloxy group, an n-pentyloxy group, an n-hexyloxy group, a cyclopentyloxy group, a cyclohexyloxy group, a cycloheptyloxy group, a cyclooctyloxy group, a 1-adamantyloxy group, a 2-adamantyloxy group, and the like. These groups are optionally bonded to each other to form a ring via a single bond, a substituted or unsubstituted methylene group, a substituted or unsubstituted amino group, an oxygen atom, or a sulfur atom.

The "substituent" of the "linear or branched alkyloxy group having 1 to 6 carbon atoms and having a substituent" or the "cycloalkyloxy group having 5 to 10 carbon atoms and having a substituent" represented by $R_1$, $R_2$, $R_3$, $R_4$, $R_5$, $R_6$, $R_7$, and $R_8$ in the structural formulae (B), (B-1), (B-2), (B-3), (B-4), (B-5), and (B') may be the same as those listed above as examples of the "substituent" of the "substituted aromatic hydrocarbon group", the "substituted aromatic heterocyclic group", or the "substituted fused polycyclic aromatic group" represented by $Ar_1$, $Ar_2$, $Ar_3$, and $Ar_4$ in the general formula (1) above. The same holds true for the forms that these groups can take.

The "aromatic hydrocarbon group", the "aromatic heterocyclic group", or the "fused polycyclic aromatic group" of the "substituted or unsubstituted aromatic hydrocarbon group", the "substituted or unsubstituted aromatic heterocyclic group", or the "substituted or unsubstituted fused polycyclic aromatic group" represented by $R_1$, $R_2$, $R_3$, $R_4$, $R_5$, $R_6$, $R_7$, and $R_8$ in the structural formulae (B), (B-1), (B-2), (B-3), (B-4), (B-5), and (B') may be the same as those listed above as examples of the "aromatic hydrocarbon group", the "aromatic heterocyclic group", or the "fused polycyclic aromatic group" of the "substituted or unsubstituted aromatic hydrocarbon group", the "substituted or unsubstituted aromatic heterocyclic group", or the "substituted or unsubstituted fused polycyclic aromatic group" represented by $Ar_1$, $Ar_2$, $Ar_3$, and $Ar_4$ in the general formula (1) above. The same holds true for the forms that these groups can take.

The "substituent" of the "substituted aromatic hydrocarbon group", the "substituted aromatic heterocyclic group", or the "substituted fused polycyclic aromatic group" represented by $R_1$, $R_2$, $R_3$, $R_4$, $R_5$, $R_6$, $R_7$, and $R_8$ in the structural formulae (B), (B-1), (B-2), (B-3), (B-4), (B-5), and (B') may be the same as those listed above as examples of the "substituent" of the "substituted aromatic hydrocarbon group", the "substituted aromatic heterocyclic group", or the "substituted fused polycyclic aromatic group" represented by $Ar_1$, $Ar_2$, $Ar_3$, and $Ar_4$ in the general formula (1) above. The same holds true for the forms that these groups can take.

Specific examples of the "aryloxy group" of the "substituted or unsubstituted aryloxy group" represented by $R_1$, $R_2$, $R_3$, $R_4$, $R_5$, $R_6$, $R_7$, and $R_8$ in the structural formulae (B), (B-1), (B-2), (B-3), (B-4), (B-5), and (B') include a phenyloxy group, a tolyloxy group, a biphenylyloxy group, a terphenylyloxy group, a naphthyloxy group, an anthryloxy group, a phenanthryloxy group, a fluorenyloxy group, an indenyloxy group, a pyrenyloxy group, a perylenyloxy group, and the like. These groups are optionally bonded to each other to form a ring via a single bond, a substituted or unsubstituted methylene group, a substituted or unsubstituted amino group, an oxygen atom, or a sulfur atom.

The "substituent" of the "substituted aryloxy group" represented by $R_1$, $R_2$, $R_3$, $R_4$, $R_5$, $R_6$, $R_7$, and $R_8$ in the structural formulae (B), (B-1), (B-2), (B-3), (B-4), (B-5), and (B') may be the same as those listed above as examples of the "substituent" of the "substituted aromatic hydrocarbon group", the "substituted aromatic heterocyclic group", or the "substituted fused polycyclic aromatic group" represented by $Ar_1$, $Ar_2$, $Ar_3$, and $Ar_4$ in the general formula (1) above. The same holds true for the forms that these groups can take.

The "aromatic hydrocarbon group", the "aromatic heterocyclic group", or the "fused polycyclic aromatic group" of the "substituted or unsubstituted aromatic hydrocarbon group", the "substituted or unsubstituted aromatic heterocyclic group", or the "substituted or unsubstituted fused polycyclic aromatic group" represented by $Ar_5$ and $Ar_6$ in the structural formulae (B), (B-2), (B-4), and (B') may be the same as those listed above as examples of the "aromatic hydrocarbon group", the "aromatic heterocyclic group", or the "fused polycyclic aromatic group" of the "substituted or unsubstituted aromatic hydrocarbon group", the "substituted or unsubstituted aromatic heterocyclic group", or the "substituted or unsubstituted fused polycyclic aromatic group" represented by $Ar_1$, $Ar_2$, $Ar_3$, and $Ar_4$ in the general formula (1) above. The same holds true for the forms that these groups can take.

The "substituent" of the "substituted aromatic hydrocarbon group", the "substituted aromatic heterocyclic group", or the "substituted fused polycyclic aromatic group" represented by $Ar_5$ and $Ar_6$ in the structural formulae (B), (B-2), (B-4), and (B') may be the same as those listed above as examples of the "substituent" of the "substituted aromatic hydrocarbon group", the "substituted aromatic heterocyclic group", or the "substituted fused polycyclic aromatic group" represented by $Ar_1$, $Ar_2$, $Ar_3$, and $Ar_4$ in the general formula (1) above. The same holds true for the forms that these groups can take.

At least one of $R_1$, $R_2$, $R_3$, $R_4$, $Ar_5$, and $Ar_6$ in the structural formula (B) above is a linking group as a binding site. That is to say, at least one of $R_1$, $R_2$, $R_3$, $R_4$, $Ar_5$, and $Ar_6$ in the structural formula (B) above is a linking group that links a nitrogen atom of an arylamine compound represented by the general formula (1) above and a group represented by the structural formula (B) above, or a linking group that links a group bonded to a nitrogen atom of an arylamine compound and a group represented by the structural formula (B) above. The linking group as a binding site also includes a single bond.

In the general formula (1), n is an integer of 0 to 4, and, from the viewpoint of a refractive index, stability in a thin film state, and durability, n is preferably 0, 1, or 2, and more preferably 0 or 1.

In the general formula (1), at least one of $Ar_1$, $Ar_2$, $Ar_3$, and $Ar_4$ is a monovalent group represented by the structural formula (B) above, or a group substituted with the monovalent group represented by the structural formula (B) above. Examples thereof include a form in which at least one of $Ar_1$, $Ar_2$, $Ar_3$, and $Ar_4$ is a monovalent group represented by the structural formula (B) above and at least one of $Ar_1$, $Ar_2$, $Ar_3$, and $Ar_4$ has a monovalent group represented by the structural formula (B) above as a substituent, a form in which any two of $Ar_1$, $Ar_2$, $Ar_3$, and $Ar_4$ are a monovalent group represented by the structural formula (B) above, and a form in which any two of $Ar_1$, $Ar_2$, $Ar_3$, and $Ar_4$ are a group substituted with the monovalent group represented by the structural formula (B) above.

In the present invention, from the viewpoint of a refractive index, stability in a thin film state, and durability, it is preferable to adopt a form in which $Ar_1$ and $Ar_4$ are a monovalent group represented by the structural formula (B) above, a form in which $Ar_1$ and $Ar_4$ are a group substituted with the monovalent group represented by the structural formula (B) above, and a form in which $Ar_1$ is a monovalent group represented by the structural formula (B) above and $Ar_4$ is a group substituted with the monovalent group represented by the structural formula (B) above, more preferable to adopt a form in which $Ar_1$ and $Ar_4$ are a group substituted with a monovalent group represented by the structural formula (B-1), (B-3), or (B-5) above, or are a monovalent group represented by the structural formula (B-2) or (B-4) above, and even more preferable to adopt a form in which $Ar_1$ and $Ar_4$ are a group substituted with a monovalent group represented by the structural formula (B-1), (B-3), or (B-5) above.

The group substituted with a monovalent group represented by the structural formulae (B-1), (B-3), and (B-5) above is preferably an aromatic hydrocarbon group, a fused polycyclic aromatic group, a thienyl group, a benzothienyl group, a dibenzofuranyl group, or a dibenzothienyl group, more preferably a phenyl group, a biphenylyl group, a terphenylyl group, a naphthyl group, a phenanthryl group, a fluorenyl group, a thienyl group, a benzothienyl group, a dibenzofuranyl group, or a dibenzothienyl group, even more preferably a phenyl group, a biphenylyl group, a fluorenyl group, a dibenzofuranyl group, or a dibenzothienyl group, and even more preferably a phenyl group.

That is to say, in the present invention, $Ar_1$ and $Ar_4$ are preferably an aromatic hydrocarbon group, a fused polycyclic aromatic group, a thienyl group, a benzothienyl group, a dibenzofuranyl group, or a dibenzothienyl group substituted with a monovalent group represented by the structural formula (B-1), (B-3), or (B-5) above, more preferably a phenyl group, a biphenylyl group, a terphenylyl group, a naphthyl group, a phenanthryl group, a fluorenyl group, a thienyl group, a benzothienyl group, a dibenzofuranyl group, or a dibenzothienyl group substituted with the monovalent group, even more preferably a phenyl group, a biphenylyl group, a fluorenyl group, a dibenzofuranyl group, or a dibenzothienyl group having the monovalent group, and even more preferably a phenyl group substituted with the monovalent group.

$Ar_1$, $Ar_2$, $Ar_3$, and $Ar_4$ other than the monovalent group represented by the structural formula (B) above and the group substituted with the monovalent group represented by the structural formula (B) above are preferably an aromatic hydrocarbon group, a fused polycyclic aromatic group, a thienyl group, a benzothienyl group, a dibenzofuranyl group, or a dibenzothienyl group, more preferably a phenyl group, a biphenylyl group, a terphenylyl group, a naphthyl group, a phenanthryl group, a fluorenyl group, a thienyl group, a benzothienyl group, a dibenzofuranyl group, or a dibenzothienyl group, even more preferably a phenyl group, a biphenylyl group, a fluorenyl group, a dibenzofuranyl group, or a dibenzothienyl group, and even more preferably a phenyl group.

$Ar_5$ and $Ar_6$ in the structural formulae (B), (B-2), (B-4), and (B') above are preferably an aromatic hydrocarbon group, a fused polycyclic aromatic group, a thienyl group, a benzothienyl group, a dibenzofuranyl group, or a dibenzothienyl group, and more preferably a phenyl group, a biphenylyl group, a terphenylyl group, a naphthyl group, a phenanthryl group, a fluorenyl group, a thienyl group, a benzothienyl group, a dibenzofuranyl group, or a dibenzothienyl group.

In the structural formula (B) above, it is preferable that only one of $R_1$, $R_2$, $R_3$, $R_4$, $Ar_5$, and $Ar_6$ is a linking group.

In the structural formulae (B) and (B') above, X represents a carbon atom or a nitrogen atom, and Y represents a carbon atom, an oxygen atom, a sulfur atom, or a nitrogen atom. It is assumed that, in the case in which Y is an oxygen atom or a sulfur atom, Y has no $Ar_6$ (there is no $Ar_6$), in the case in which X and Y are a nitrogen atom, X or Y has no $Ar_5$ nor $Ar_6$ (there is no $Ar_5$ nor $Ar_6$), and, in the case in which X is a nitrogen atom and Y is a carbon atom, X or Y has no $Ar_5$ nor $Ar_6$ (there is no $Ar_5$ nor $Ar_6$).

In the structural formulae (B) and (B') above, in the case in which X is a nitrogen atom, Y is preferably a nitrogen atom, and, in this case, $Ar_5$ or $Ar_6$ preferably serves as a linking group to be linked to a carbon atom of a group represented by $Ar_1$, $Ar_2$, $Ar_3$, or $Ar_4$ (a monovalent group represented by the structural formula (B) or (B') serves as a substituent for $Ar_1$, $Ar_2$, $Ar_3$, or $Ar_4$) from the viewpoint of compound stability.

In the structural formulae (B) and (B') above, in the case in which X is a carbon atom, Y is preferably a carbon atom, an oxygen atom, or a sulfur atom, and more preferably an oxygen atom or a sulfur atom. In the structural formulae (B) and (B'), the case in which X is a nitrogen atom and Y is an oxygen atom or a sulfur atom is excluded from the present invention.

Specific examples of preferred compounds, of the arylamine compound represented by the general formula (1) above and favorably used for the organic EL element of the present invention, are shown as below, but the present invention is not limited to these compounds.

[Chem. 9]

(1-1)

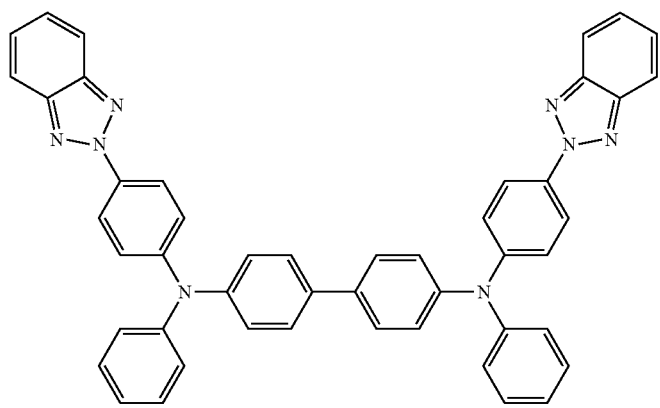

(1-2)

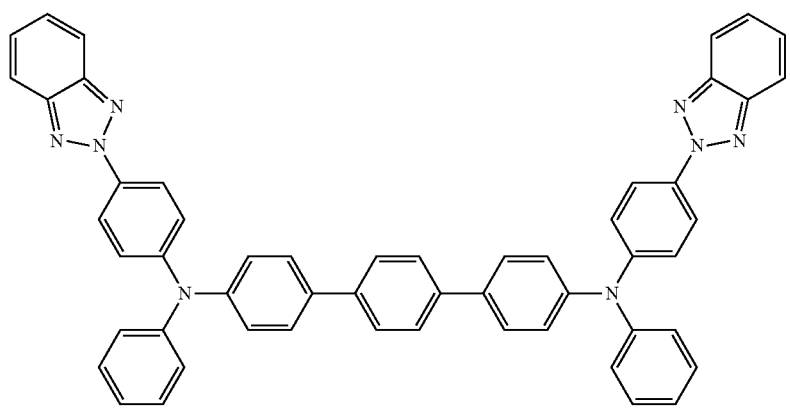

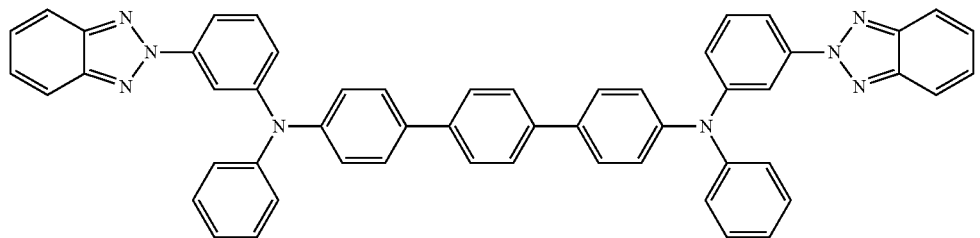
(1-3)
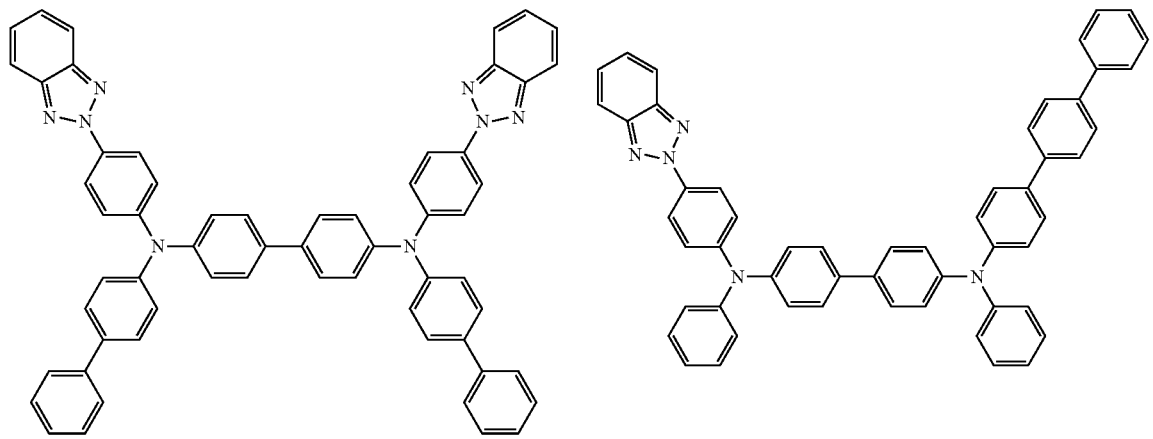
(1-4)    (1-5)
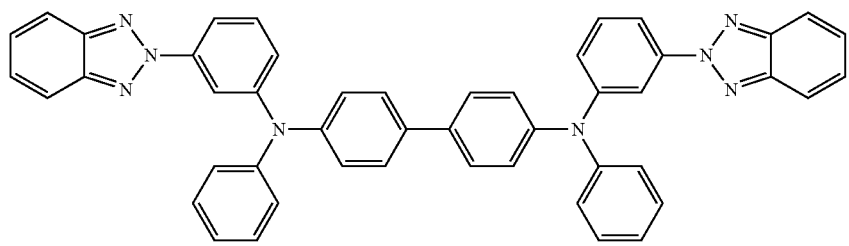
(1-6)
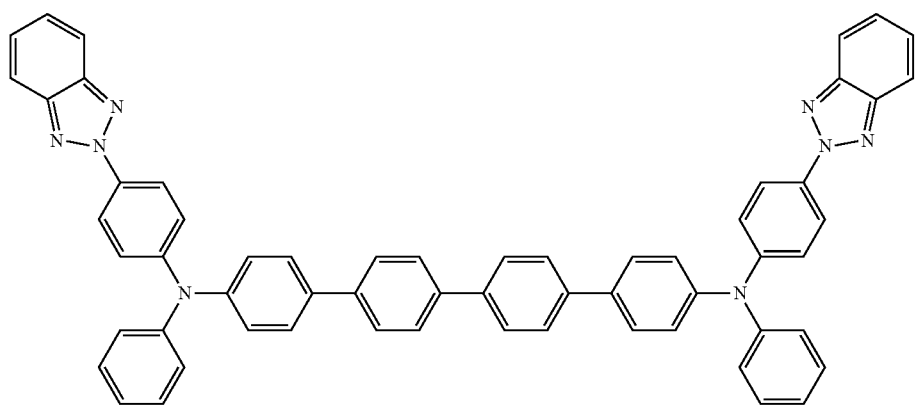
(1-7)

(1-8)
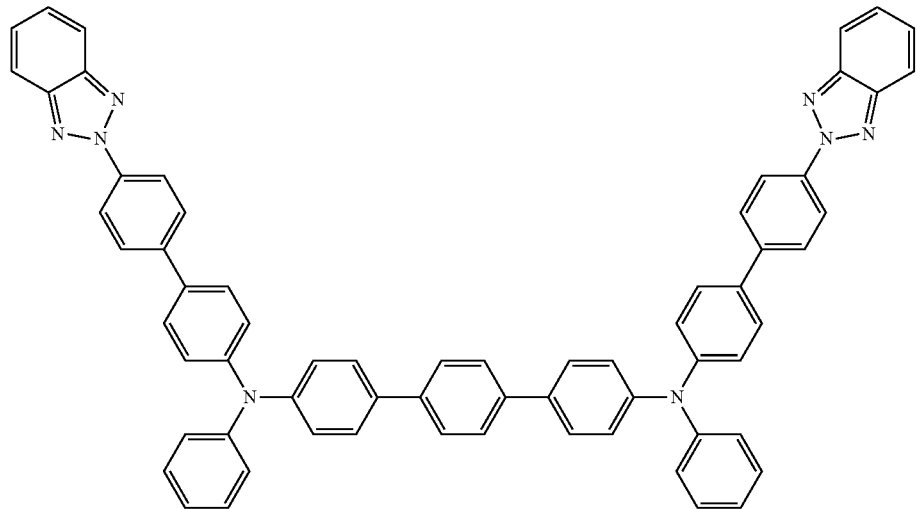
(1-9)
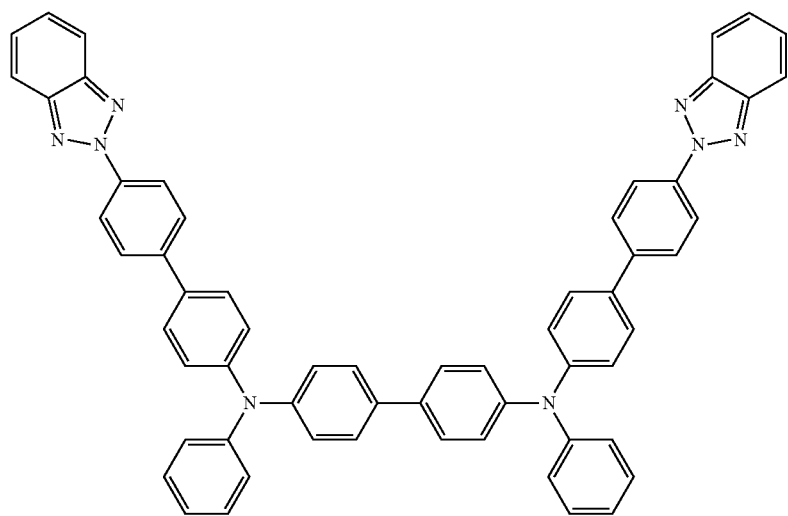
(1-10)
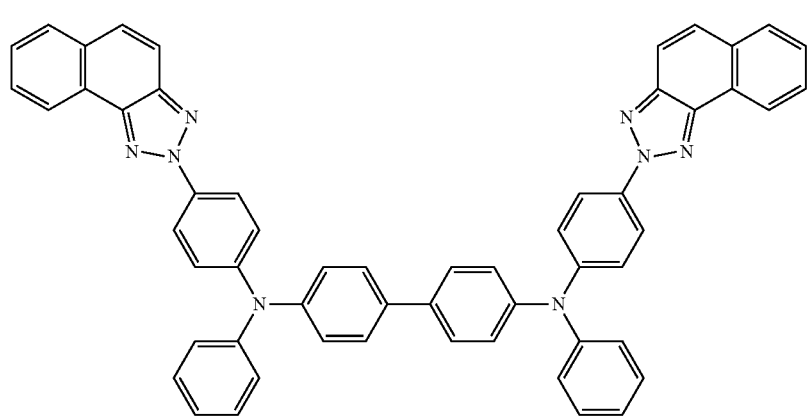

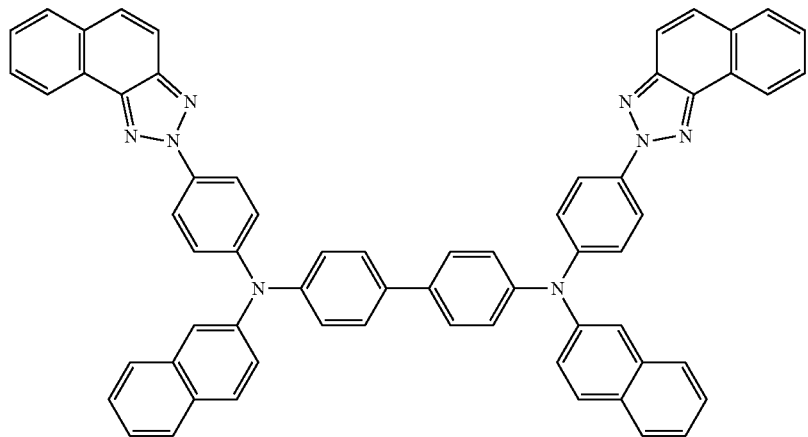
(1-11)
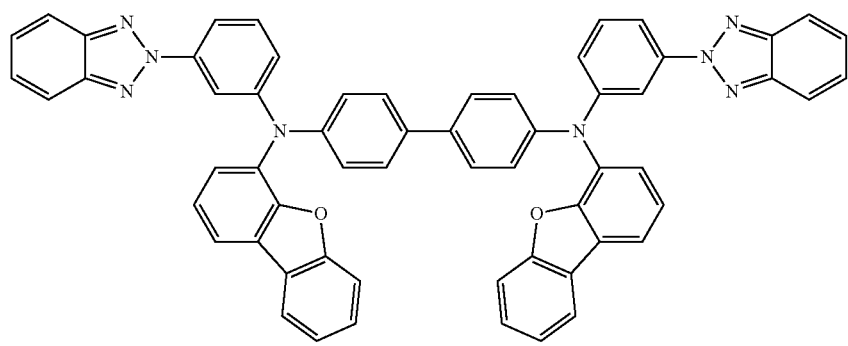
(1-12)
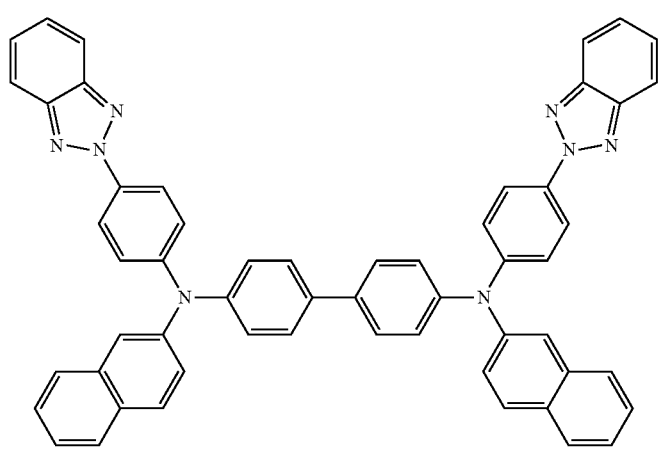
(1-13)

(1-14)
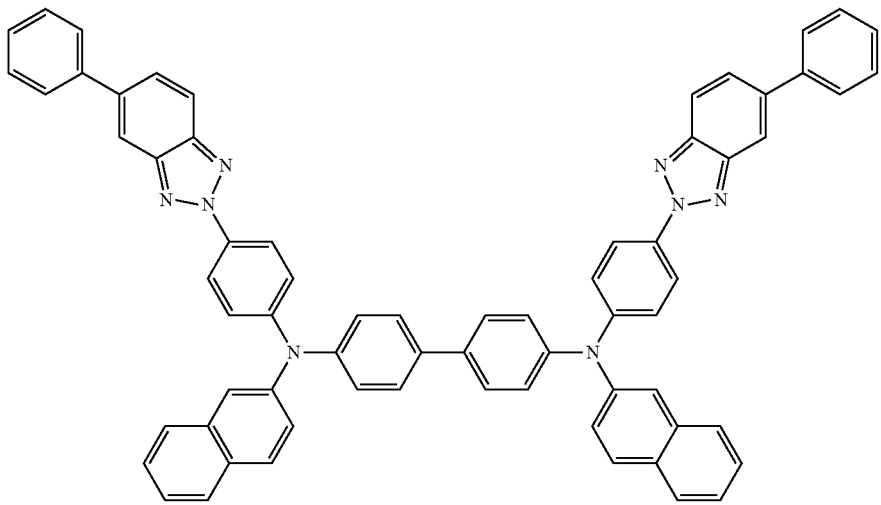
(1-15)
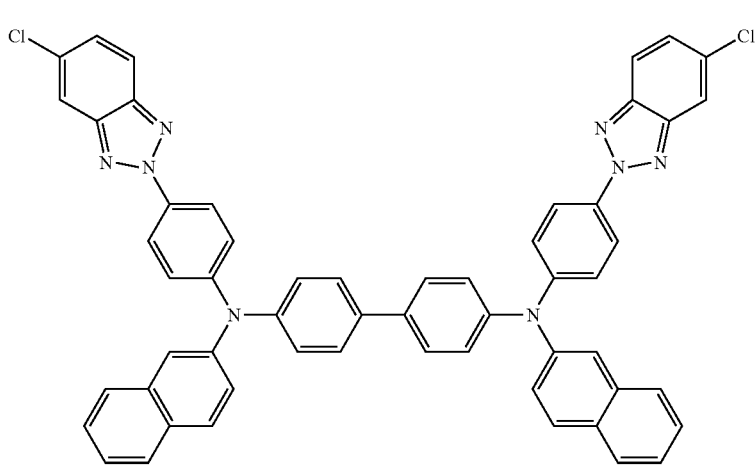
[Chem. 10]
(1-16)
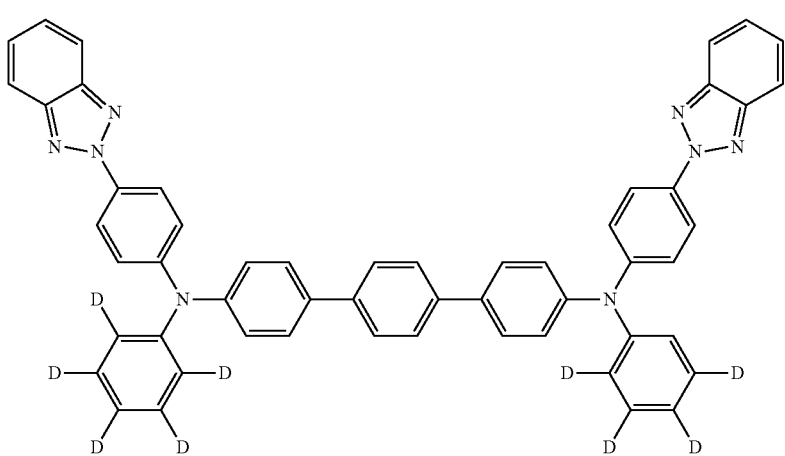

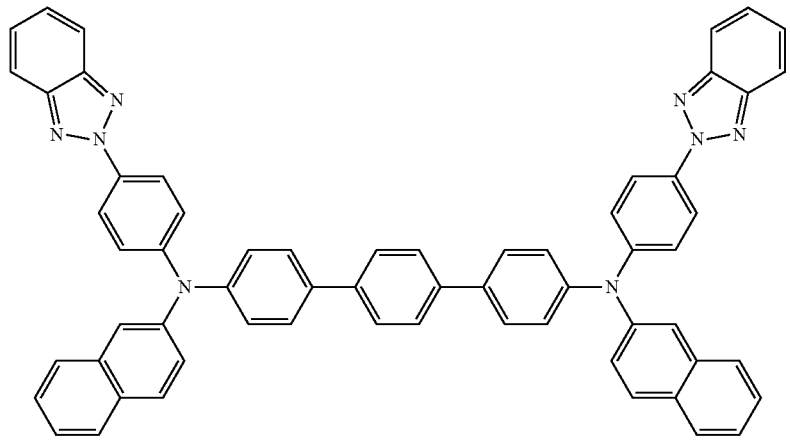
(1-17)
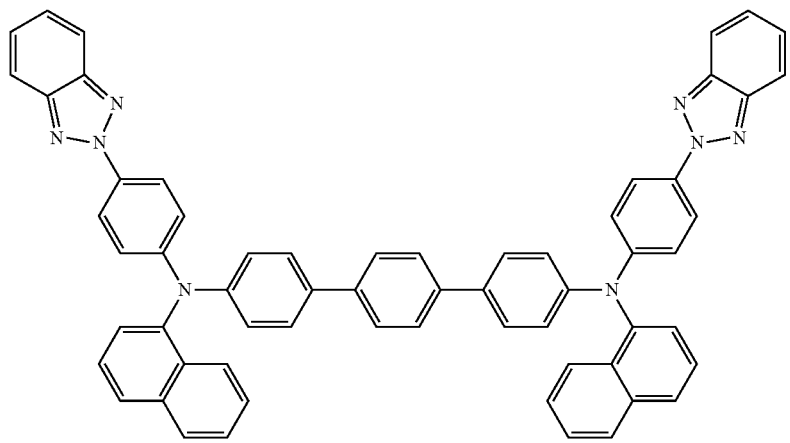
(1-18)
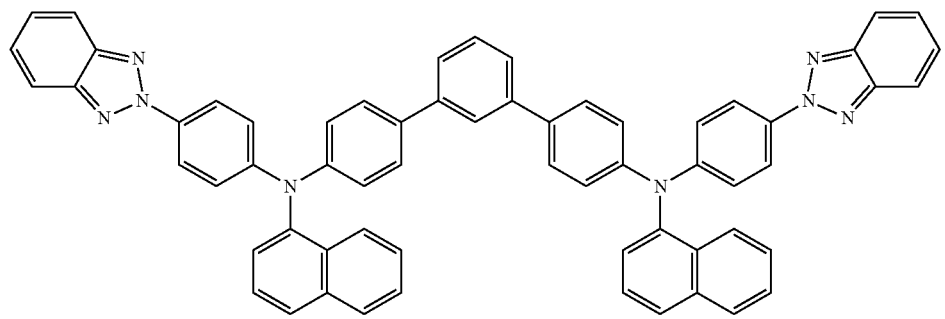
(1-19)
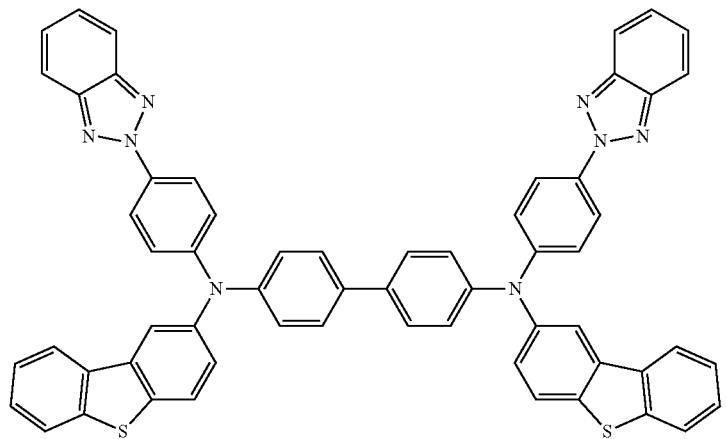
(1-20)

-continued
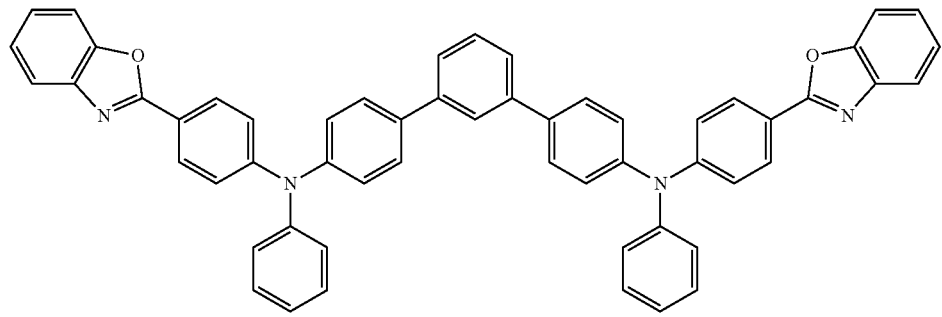
(1-21)
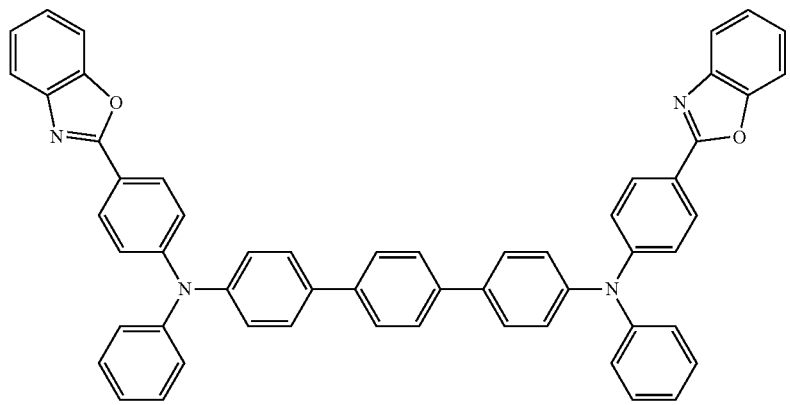
(1-22)
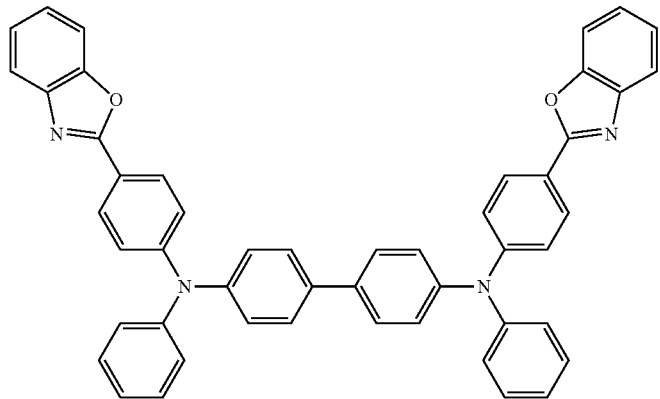
(1-23)
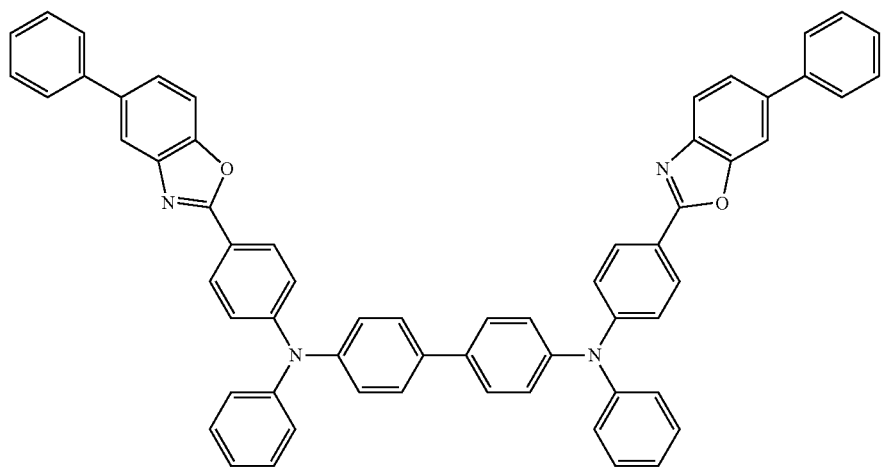
(1-24)

-continued
(1-25)
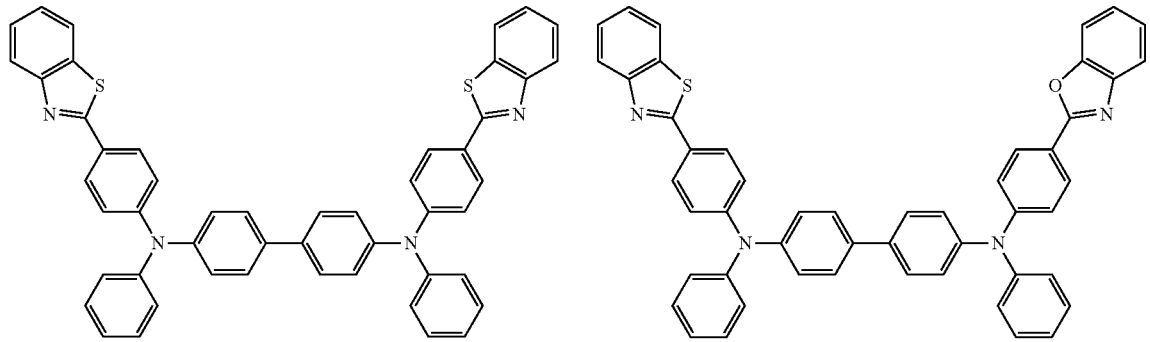
(1-26)
(1-27)
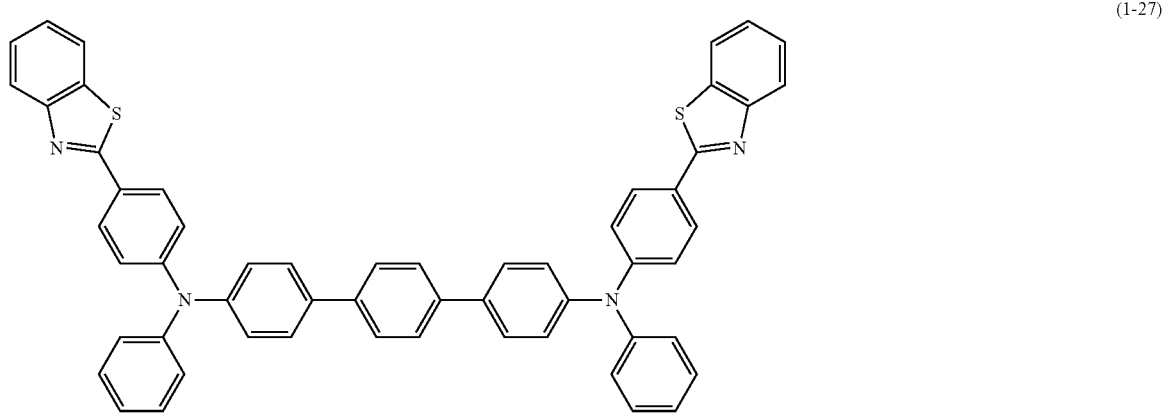
(1-28)
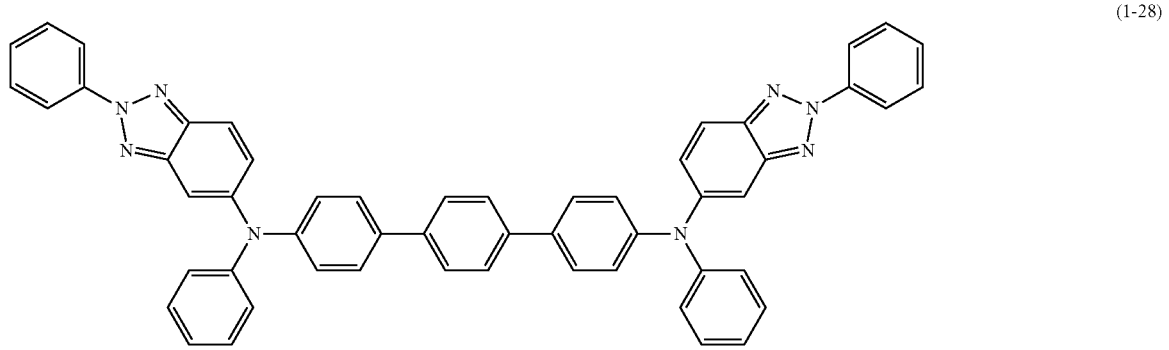
(1-29)
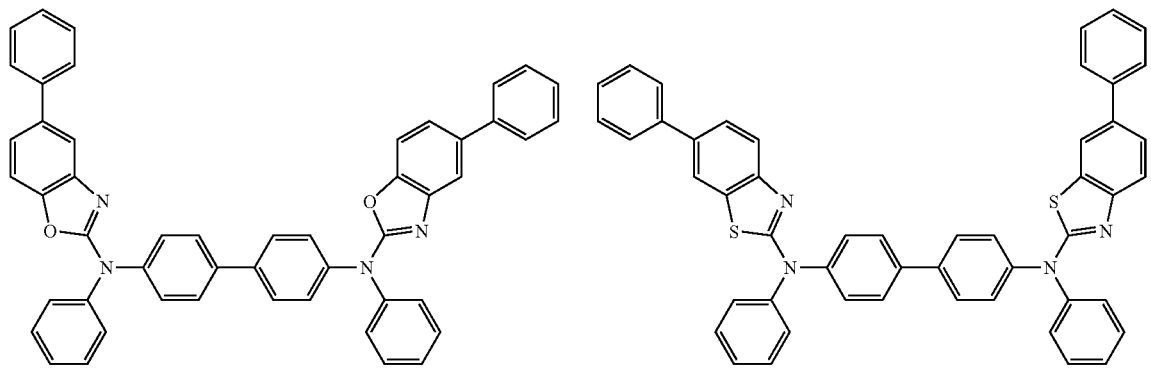
(1-30)

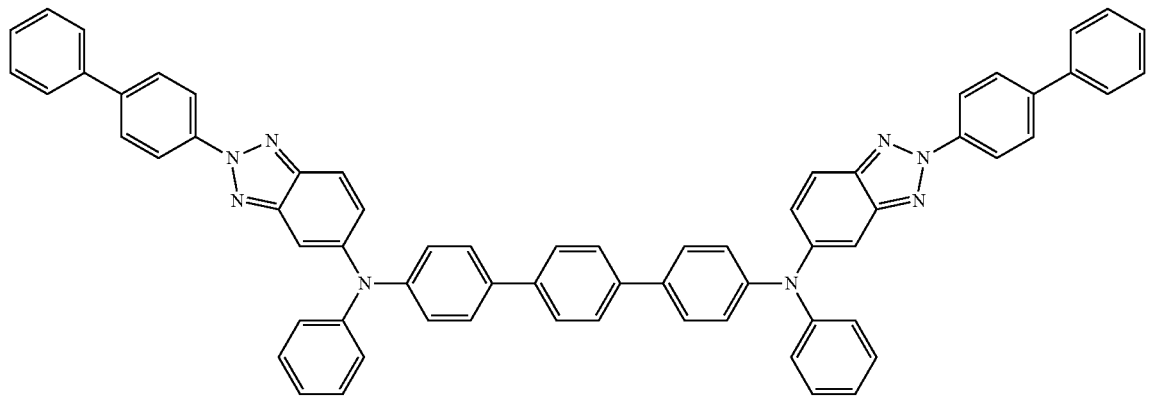
(1-31)
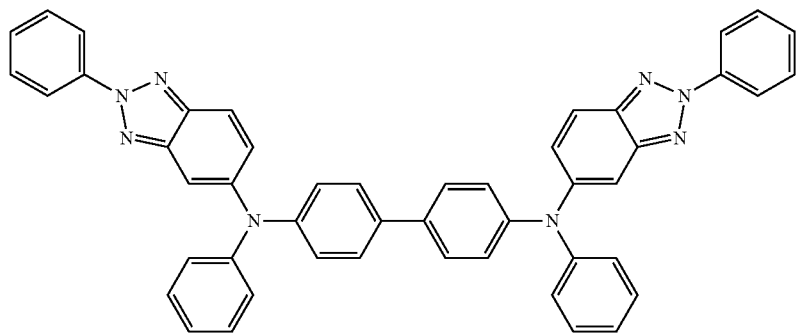
(1-32)
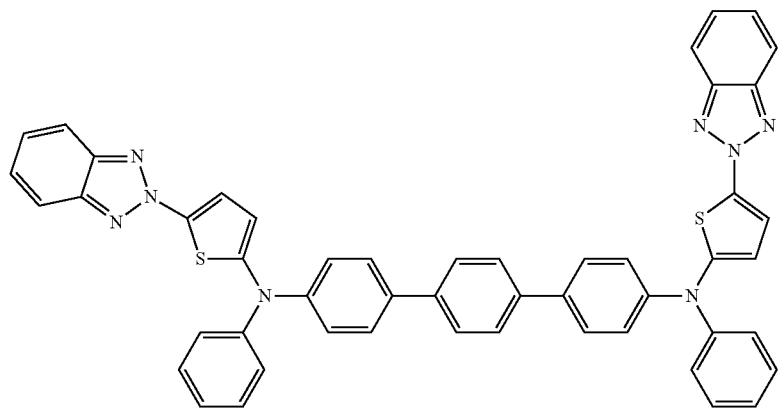
(1-33)
[Chem. 11]
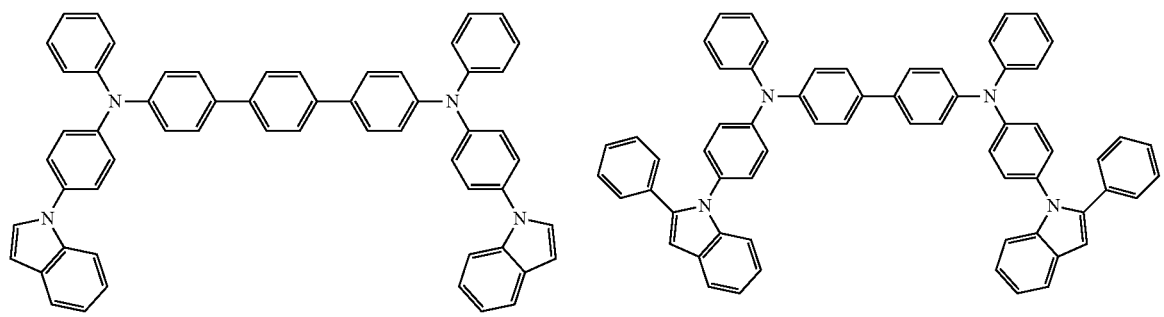
(1-34)    (1-35)

-continued
(1-36)
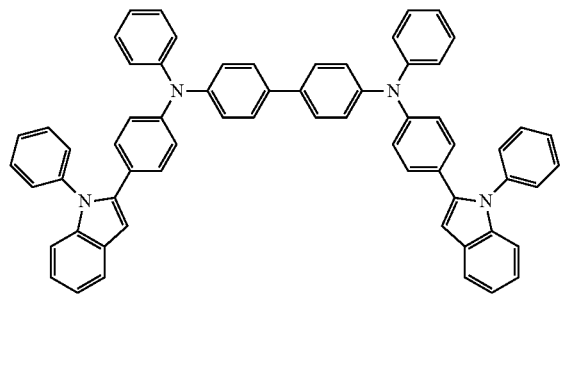
(1-37)
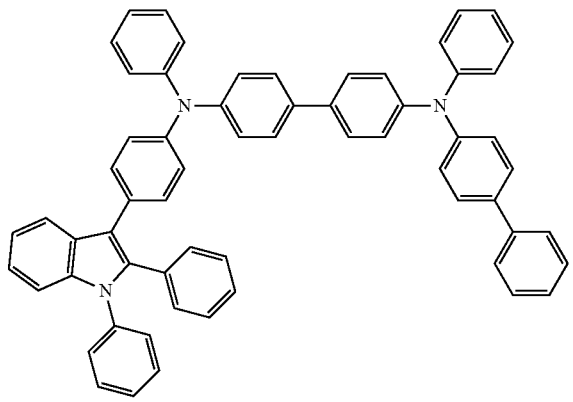
(1-38)
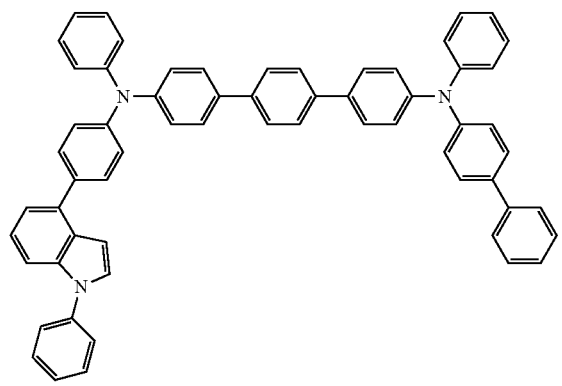
(1-39)
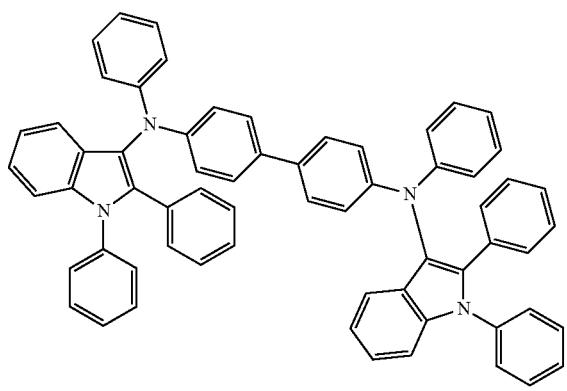
(1-40)
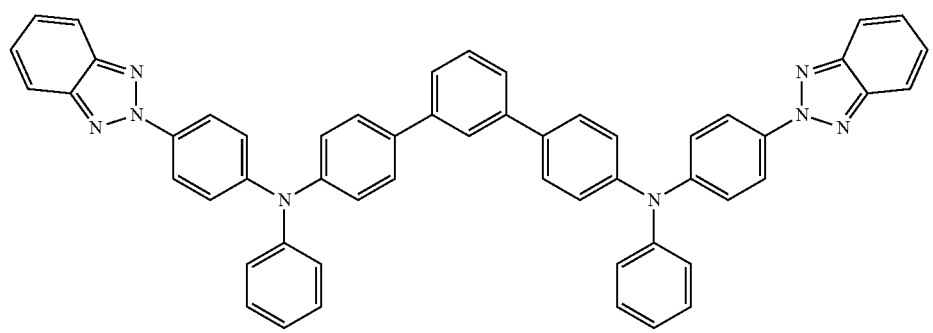
(1-41)
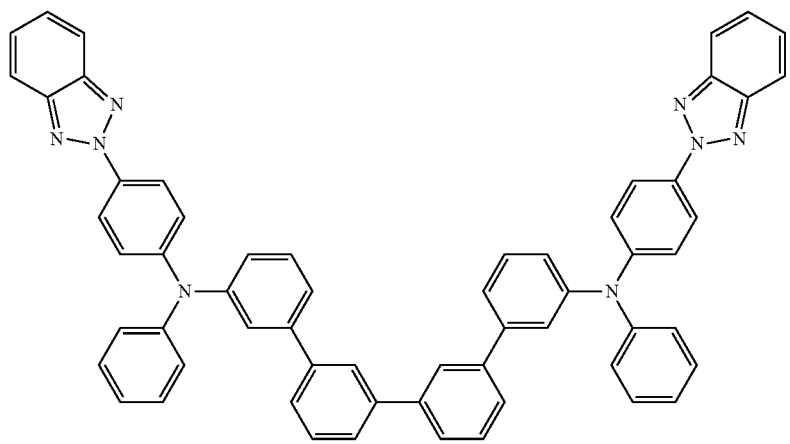

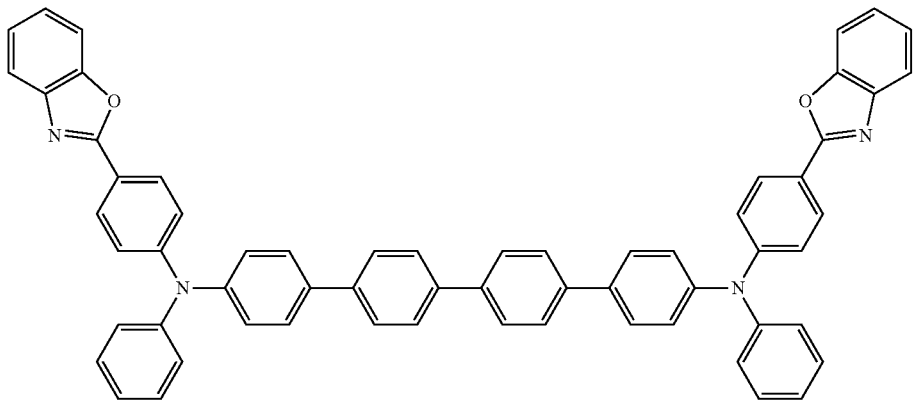
(1-42)
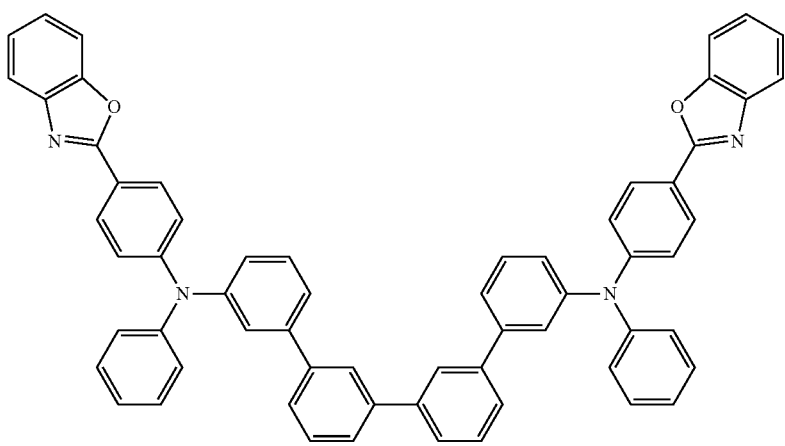
(1-43)
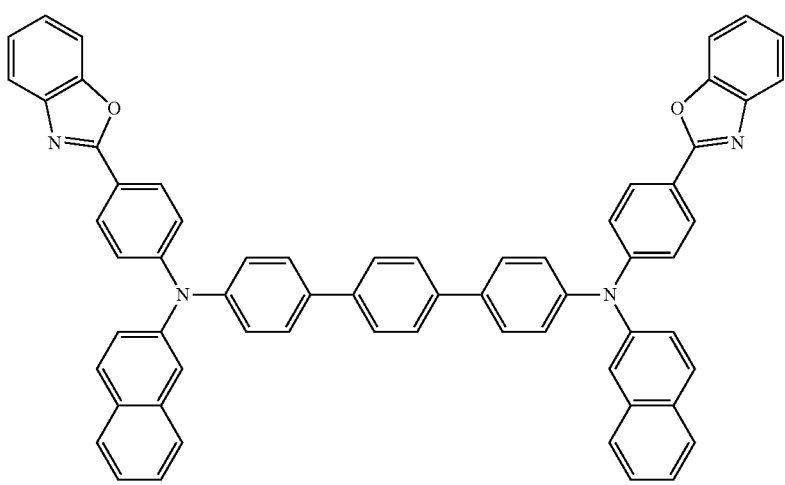
(1-44)

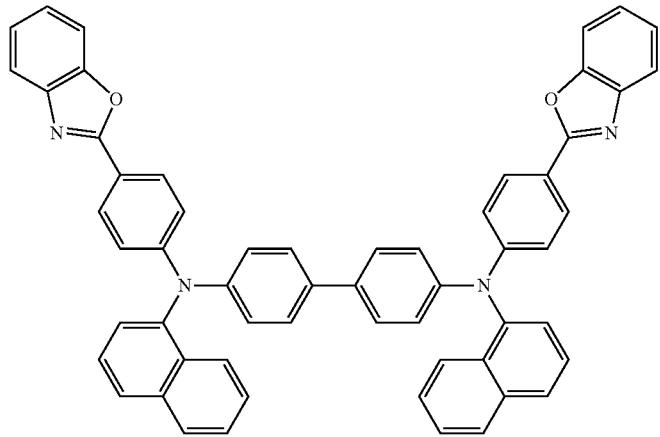
(1-45)
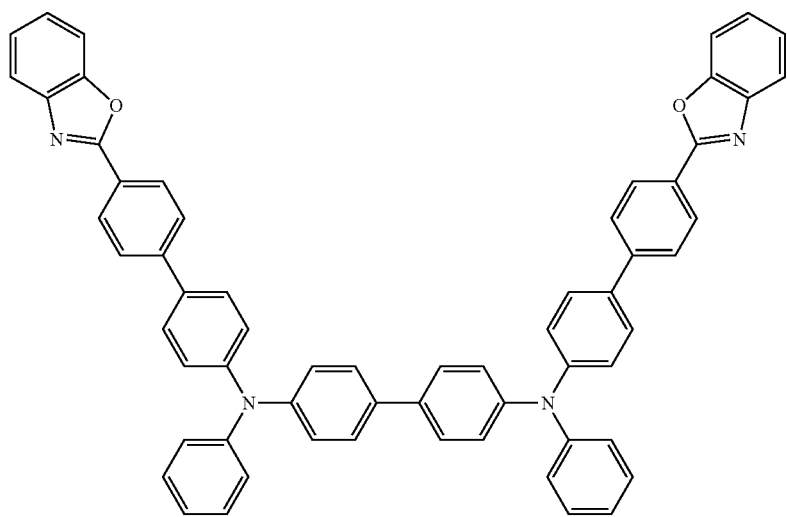
(1-46)
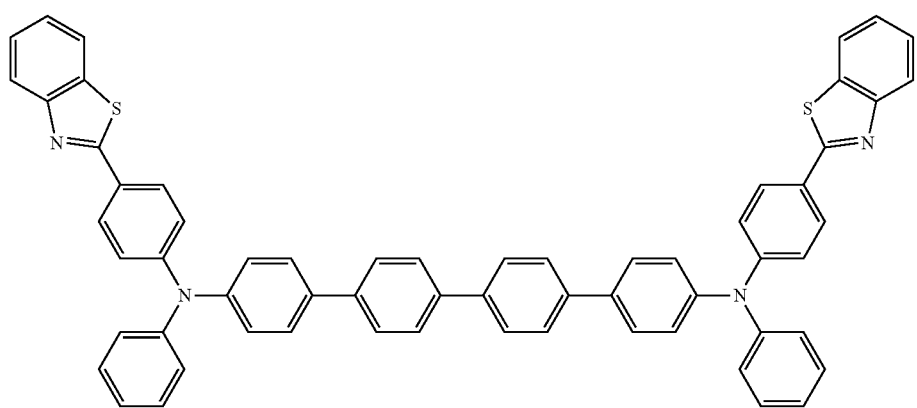
(1-47)

(1-48)
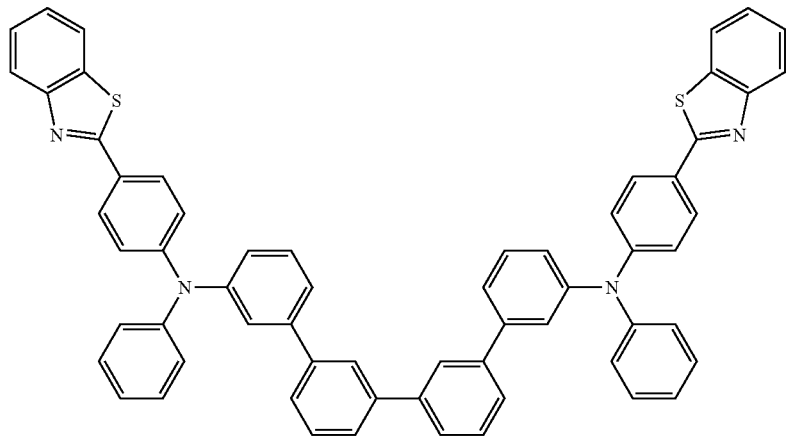
[Chem. 12]
(1-49)
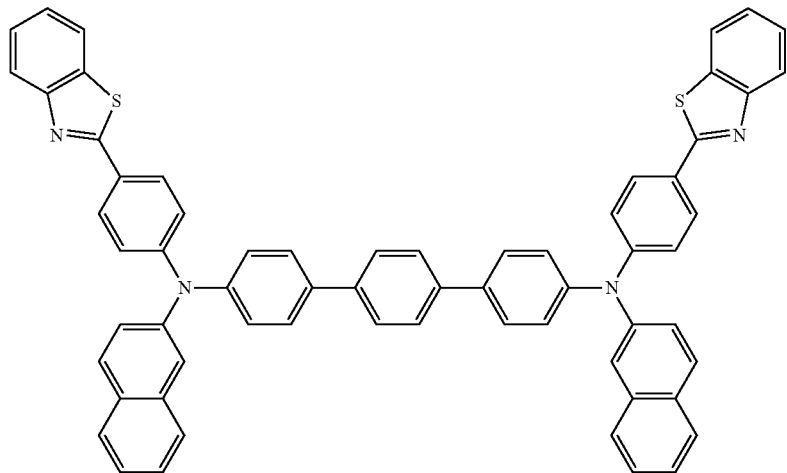
(1-50)
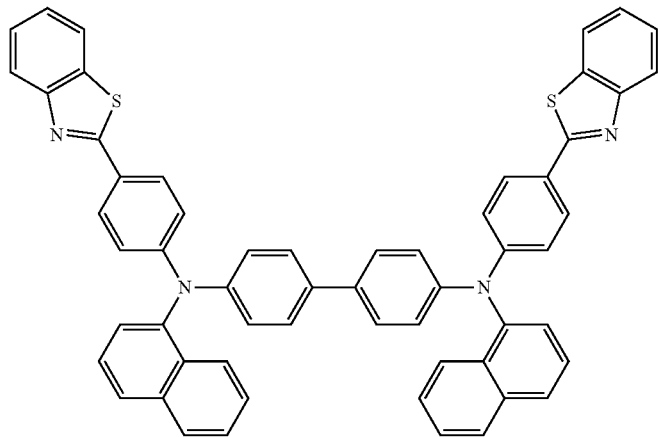

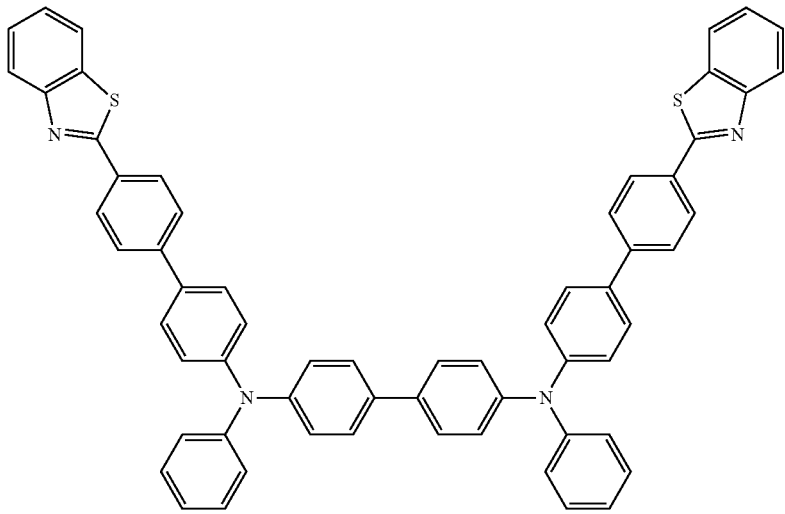
(1-51)
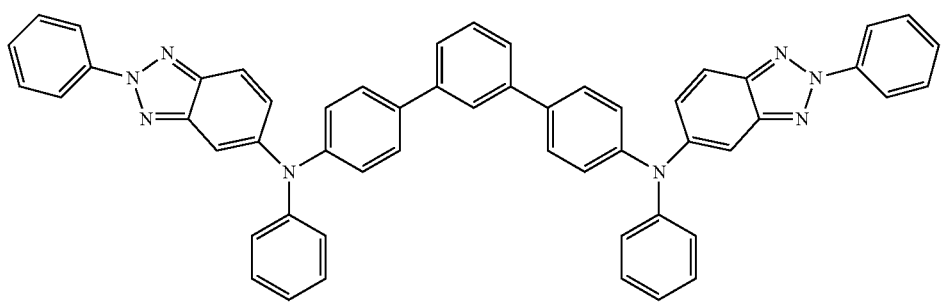
(1-52)
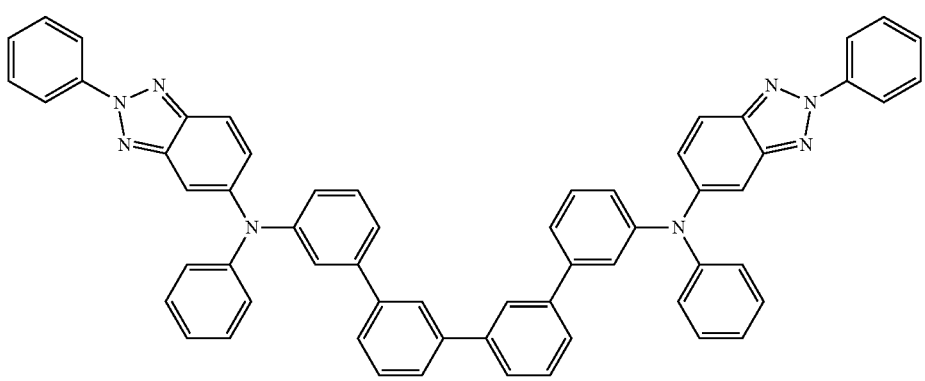
(1-53)
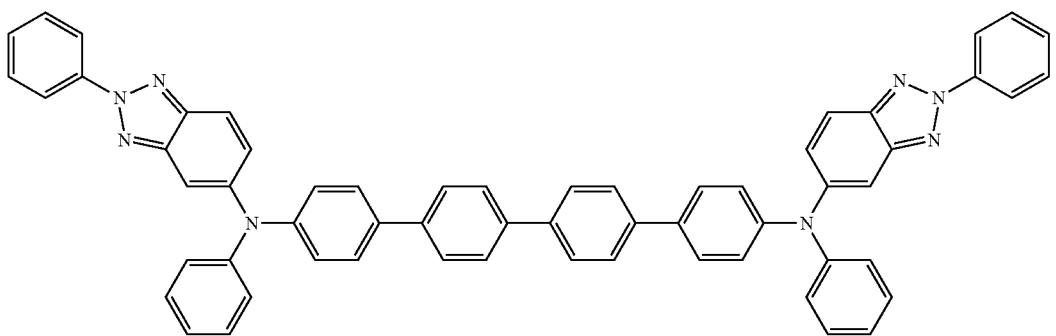
(1-54)

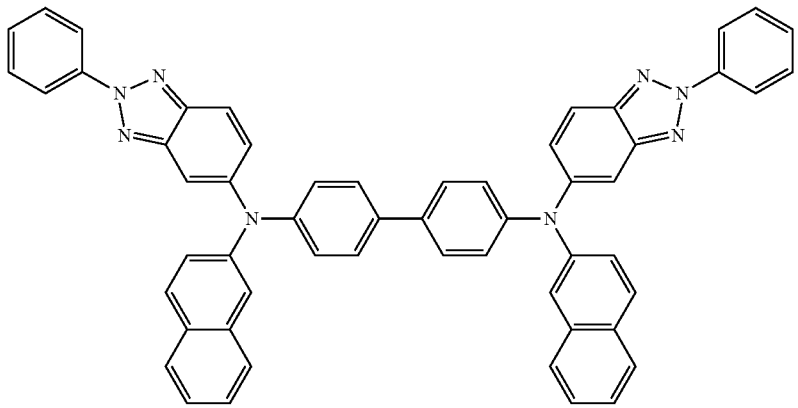

(1-55)

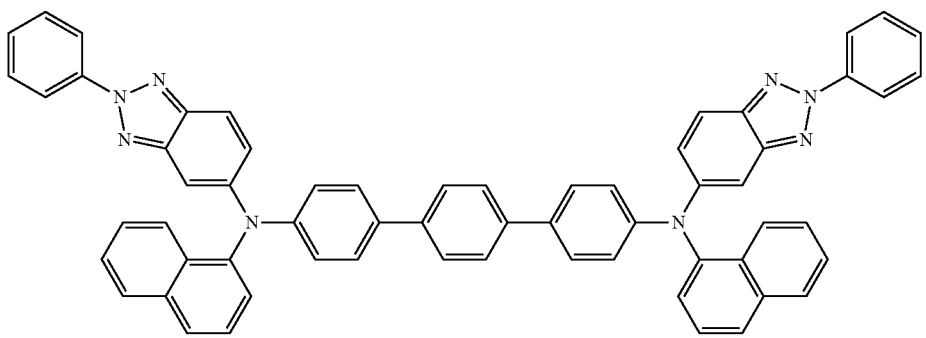

(1-56)

The above-described arylamine compound can be synthesized according to known methods (see Patent Literature 3, for example).

These compounds can be purified using a method such as: purification through column chromatography; purification through adsorption using silica gel, activated carbon, activated clay, or the like; or recrystallization or crystallization using a solvent. In the present invention, it is preferable to ultimately perform purification through sublimation after performing these types of purification.

The glass transition point (Tg) and the refractive index are preferably measured as the physical properties of these compounds. The glass transition point (Tg) is an indicator of stability in a thin film state, and the refractive index is an indicator of improvement in the light extraction efficiency.

The glass transition point (Tg) can be measured using a powder and a high-sensitivity differential scanning calorimeter (DSC3100S manufactured by Bruker AXS K.K.).

The refractive index can be measured using an 80-nm thin film formed on a silicon substrate, and a spectroscopic measurement device (F10-RT-UV manufactured by Filmetrics).

The arylamine compound represented by the general formula (1) above and favorably used for the organic EL element of the present invention can be used as a constituent material for a hole injection layer, a hole transport layer, a light emitting layer, an electron blocking layer, or a capping layer of an organic EL element.

The organic EL element of the present invention may be a light emitting element with a top emission structure, and may have a structure constituted by an anode made of metal, a hole transport layer, a light emitting layer, an electron transport layer, a translucent cathode, a first capping layer, and a second capping layer sequentially provided on a glass substrate, a structure in which a hole injection layer is further provided between the anode and the hole transport layer, a structure in which an electron blocking layer is further provided between the hole transport layer and the light emitting layer, a structure in which a hole blocking layer is further provided between the light emitting layer and the electron transport layer, and a structure in which a an electron injection layer is further provided between the electron transport layer and the cathode. In these multilayer structures, a single organic layer may fulfill the functions of a number of layers, and, for example, a configuration in which a single organic layer serves as both the hole transport layer and the electron blocking layer, a configuration in which a single organic layer serves as both the electron transport layer and the hole blocking layer, and the like may also be adopted. The total film thickness of the layers of the organic EL element is preferably approximately from 200 to 750 nm, and more preferably approximately from 350 to 600 nm. Furthermore, the total film thickness of the first capping layer and the second capping layer is, for example, preferably from 30 to 120 nm, and more preferably from 40 to 80 nm. In this case, it is possible to obtain good light extraction efficiency. Note that the film thicknesses of the first capping layer and the second capping layer may be changed as appropriate according to the type of light emitting material used in the light emitting element, the thickness of the organic EL element excluding the capping layer, and the like.

An electrode material having a high work function, such as ITO or gold, is used for the anode of the organic EL element of the present invention.

Arylamine compounds having a molecular structure in which three or more triphenylamine structures are linked to each other via a single bond or a divalent group not containing a hetero atom, for example, materials such as starburst triphenylamine derivatives and various triphenylamine tetramers, porphyrin compounds typified by copper phthalocyanine, acceptor type heterocyclic compounds such as hexacyanoazatriphenylene, coating type polymer materials, and the like can be used as the material for the hole injection layer of the organic EL element of the present invention.

N,N'-diphenyl-N,N'-di(m-tolyl)benzidine (hereinafter referred to simply as "TPD"), N,N'-diphenyl-N,N'-di(α-naphthyl)benzidine (NPD), 1,1-bis[4-(di-4-tolylamino)phenyl]cyclohexane (TAPC), and the like can be used as the material for the hole transport layer of the organic EL element of the present invention. In particular, arylamine compounds having a molecular structure in which two triphenylamine structures are linked to each other via a single bond or a divalent group not containing a hetero atom, for example, N,N,N',N'-tetrabiphenylyl benzidine and the like are preferably used. Also, arylamine compounds having a molecular structure in which three or more triphenylamine structures are linked to each other via a single bond or a divalent group not containing a hetero atom, for example, various triphenylamine trimers and tetramers are preferably used.

Furthermore, a material that is obtained by p-doping a material normally used for the hole injection layer and the hole transport layer with trisbromophenylamine hexachloroantimony, a polymer compound that has the structure of a benzidine derivative, such as TPD, in a partial structure thereof, and the like can be used as the material for the hole injection layer and the hole transport layer.

Compounds having an electron blocking effect, such as carbazole derivatives such as 4,4',4"-tri(N-carbazolyl)triphenylamine (hereinafter referred to simply as "TCTA"), 9,9-bis[4-(carbazole-9-yl)phenyl]fluorene, 1,3-bis(carbazole-9-yl)benzene (hereinafter referred to simply as "mCP"), and 2,2-bis(4-carbazole-9-ylphenyl)adamantane (Ad-Cz), and compounds that have a triphenylsilyl group and a triarylamine structure and are typified by 9-[4-(carbazole-9-yl)phenyl]-9-[4-(triphenylsilyl)phenyl]-9H-fluorene can be used as the material for the electron blocking layer of the organic EL element of the present invention.

Metal complexes of quinolinol derivatives such as $Alq_3$, various types of metal complexes, an anthracene derivative, a bisstyrylbenzene derivative, a pyrene derivative, an oxazole derivative, a poly(p-phenylene vinylene) derivative, and the like can be used as the material for the light emitting layer of the organic EL element of the present invention. Moreover, the light emitting layer may also be formed using a host material and a dopant material. As the host material, a thiazole derivative, a benzimidazole derivative, a polydialkylfluorene derivative, and the like can be used in addition to the above-listed light emitting materials. As the dopant material, quinacridone, coumarin, rubrene, perylene, and derivatives thereof, a benzopyran derivative; a rhodamine derivative; an aminostyryl derivative; and the like can be used.

Furthermore, it is also possible to use a phosphorescent emitter as the light emitting material. As the phosphorescent emitter, a phosphorescent emitter of a metal complex of iridium, platinum, or the like can be used. Examples thereof include a green phosphorescent emitter such as $Ir(ppy)_3$, a blue phosphorescent emitter such as FIrpic or FIr6, a red phosphorescent emitter such as $Btp_2Ir$ (acac), and the like. In this case, as host materials having hole injectability and transportability, carbazole derivatives such as 4,4'-di(N-carbazolyl)biphenyl (CBP), TCTA, and mCP can be used as the host material. Furthermore, as host materials having electron transportability, p-bis(triphenylsilyl)benzene (UGH2) and 2,2',2"-(1,3,5-phenylene)-tris(1-phenyl-1H-benzimidazole) (TPBI) can be used. When these materials are used, a high-performance organic EL element can be produced.

In order to avoid concentration quenching, it is preferable that doping of the host material with a phosphorescent light emitting material is performed within a range of 1 to 30 wt % with respect to the entire light emitting layer through co-deposition.

As the light emitting material, materials that emit delayed fluorescence, such as CDCB derivatives such as PIC-TRZ, CC2TA, PXZ-TRZ, and 4CzIPN, can also be used (see Non-Patent Literature 7, for example).

Compounds having a hole blocking effect, such as a phenanthroline derivative, such as bathocuproine (BCP); a metal complex of a quinolinol derivative, such as aluminum (III) bis(2-methyl-8-quinolinato)-4-phenylphenolate (hereinafter abbreviated as BAlq); various types of rare-earth complexes; a triazole derivative; a triazine derivative; and an oxadiazole derivative, can be used as the material for the hole blocking layer of the organic EL element of the present invention. These materials may also serve as the material for the electron transport layer.

Metal complexes of quinolinol derivatives such as $Alq_3$ and BAlq, various types of metal complexes, a triazole derivative, a triazine derivative, an oxadiazole derivative, a thiadiazole derivative, a pyridoindole derivative, a carbodiimide derivative, a quinoxaline derivative, a phenanthroline derivative, a silole derivative, and the like can be used as the material for the electron transport layer of the organic EL element of the present invention. It is preferable that these compounds can form an electron transport layer that satisfies the general formula (I) above.

Alkali metal salts such as lithium fluoride and cesium fluoride, alkaline earth metal salts such as magnesium fluoride, metal oxides such as aluminum oxide, and the like can be used as the material for the electron injection layer of the organic EL element of the present invention. When an electron transport layer and a cathode are suitably selected, the electron injection layer can be omitted.

Furthermore, a material obtained by n-doping a material normally used for the electron injection layer and the electron transport layer with a metal such as cesium can be used as the material for the electron injection layer and the electron transport layer.

An electrode material having a low work function such as aluminum, an alloy having an even lower work function such as a magnesium-silver alloy, a magnesium-calcium alloy, a magnesium-indium alloy, or an aluminum-magnesium alloy, ITO, IZO, or the like is used as the electrode material of the translucent cathode of the organic EL element of the present invention.

An arylamine compound or the like is preferably used as a material for the first capping layer of the organic EL element of the present invention.

An arylamine compound represented by the general formula (1) above or the like is preferably used for the second capping layer of the organic EL element of the present invention.

With these materials for use in the layers constituting the organic EL element of the present invention, a thin film can be formed using a known method such as vapor deposition, spin coating, or inkjet printing.

Although a film may be formed using one type of these materials, a film may also be formed using a mixture of a plurality of types, and the thus formed films can each be used as a single layer. Also, it is also possible to adopt a structure in which layers that are each formed using one type of these materials alone are stacked; a structure in which layers that are each formed using a mixture of a plurality of types are stacked; or a structure in which a layer that is formed using one type of these materials alone and a layer that is formed using a mixture of a plurality of types are stacked.

In the description above, an organic EL element with a top emission structure has been described, but the present invention is not limited thereto, and can also be applied in a similar manner to an organic EL element with a bottom emission structure or an organic EL element with a dual emission structure in which light is emitted from both of the top and the bottom. In these cases, an electrode located in a direction in which light is extracted from the light emitting element to the outside has to be transparent or translucent.

The refractive index of the second capping layer is preferably higher than the refractive index of the first capping layer located adjacent thereto throughout a wavelength range from 450 to 650 nm, and the refractive index of the first capping layer is preferably higher than the refractive index of the electron transport layer throughout a wavelength range from 450 to 550 nm. That is to say, the light extraction efficiency of the organic EL element is improved due to the second capping layer that has a high refractive index, and, when the reflectance is high between the second capping layer and the first capping layer and between the first capping layer and the electron transport layer, this effect increases due to a larger optical interference effect. Accordingly, the refractive index of the second capping layer is preferably higher than the refractive index of the first capping layer located adjacent thereto. Although it is sufficient that the refractive index of the second capping layer is 1.70 or more throughout a wavelength range from 450 to 750 nm, it is preferably 1.80 or more, more preferably 1.85 or more, and even more preferably 1.90 or more.

As described above, the refractive index of the second capping layer is preferably higher than the refractive index of the first capping layer throughout a wavelength range from 450 to 650 nm, and, specifically, it is higher than the refractive index of the first capping layer preferably by 0.05 or more, and more preferably by 0.1 or more.

Furthermore, as described above, the refractive index of the first capping layer is preferably higher than the refractive index of the electron transport layer, and, specifically, it is preferable that a refractive index ($n_2$) of the electron transport layer and a refractive index ($n_1$) of the first capping layer satisfy the general formula (I) as below throughout a wavelength range from 450 to 550 nm:

$$0.005 \leq n_1 - n_2 \leq 0.15 \tag{I}$$

When the capping layer has a structure constituted by two layers consisting of a first capping layer and a second capping layer as described above, and the refractive index of the first capping layer and the refractive index of the electron transport layer satisfy the above-mentioned condition, in the organic EL element of the present invention, the color purity is maintained, and the light extraction efficiency is significantly improved. In particular, in the case in which the organic EL element of the present invention is a blue light emitting element, the effect of maintaining the color purity and improving the light extraction efficiency is significant.

Regarding the constituent materials for these layers, for example, it is sufficient that materials that can be used to form the first capping layer and the electron transport layer that satisfy the general formula (I) above are selected from materials that have a refractive index that is lower than the refractive index of the second capping layer containing the arylamine compound represented by the general formula (1) above.

Hereinafter, embodiments of the present invention will be described in greater detail using examples. However, the present invention is not limited to the examples below.

EXAMPLES

Example 1

Synthesis of N,N'-bis{4-(2H-benzo[1,2,3]triazole-2-yl)phenyl}-N,N'-diphenyl-4,4'-diamino-1,1'-biphenyl (Compound 1-1))

First, 4.2 g of 2-(4-bromophenyl)-2H-benzo[1,2,3]triazole, 2.3 g of N,N'-diphenylbenzidine, 2.0 g of tert-butoxy sodium, and 50 ml of toluene were added to a nitrogen-purged reaction vessel, and a nitrogen gas was passed therethrough under ultrasonic irradiation for 30 minutes. Then, 62.0 mg of palladium acetate and 0.2 ml of tri-tert-butylphosphine were added thereto, and the mixture was heated and stirred at 91° C. for 5 hours. After cooling to room temperature, 50 ml of toluene was added thereto, and an organic layer was taken out through extraction. The organic layer was concentrated, purified through column chromatography (carrier: NH silica gel, eluent: toluene/n-hexane), and then subjected to dispersion and washing using 100 ml of n-hexane, and thus 3.3 g (with a yield of 66%) of a yellow powder of N,N'-bis{4-(2H-benzo[1,2,3]triazole-2-yl)phenyl}-N,N'-diphenyl-4,4'-diamino-1,1'-biphenyl (Compound (1-1)) was obtained.

The structure of the obtained yellow powder was identified using NMR.

In $^1$H-NMR (THF-d$_8$), the following signals of 34 hydrogens were detected. δ (ppm)=8.26 (4H), 7.89 (4H), 7.60 (4H), 7.39 (4H), 7.33 (4H), 7.24 (4H), 7.21 (8H), 7.10 (2H)

[Chem. 13]

(1-1)

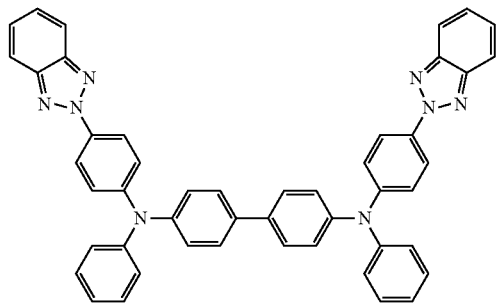

Example 2

Synthesis of N,N'-bis{4-(2H-benzo[1,2,3]triazole-2-yl)phenyl}-N,N'-diphenyl-4,4"-diamino-1,1':4',1"-terphenyl (Compound 1-2))

First, 14.0 g of 4,4"-diiodo-1,1':4',1"-terphenyl, 18.3 g of {4-(2H-benzo[1,2,3]triazole-2-yl)phenyl}phenylamine, 13.2 g of potassium carbonate, 0.3 g of copper powder, 0.9 g of sodium bisulfite, 0.7 g of 3,5-di-tert-butylsalicylic acid, and 30 ml of dodecylbenzene were added to a nitrogen-purged reaction vessel, and the mixture was heated and stirred at 210° C. for 44 hours. After allowing to cool to room temperature, 50 ml of toluene was added thereto, and a precipitate was taken out through filtration. Then, 230 ml of 1,2-dichlorobenzene was added to the precipitate, and the mixture was heated to dissolve the precipitate and filtered under heating to remove an insoluble matter. The filtrate was concentrated, purified through crystallization using 1,2-dichlorobenzene, and then subjected to dispersion and washing using methanol, and thus 22.2 g (with a yield of 96%) of a yellow powder of N,N'-bis{4-(2H-benzo[1,2,3]triazole-2-yl)phenyl}-N,N'-diphenyl-4,4"-diamino-1,1':4',1"-terphenyl (Compound (1-2)) was obtained.

The structure of the obtained yellow powder was identified using NMR.

In $^1$H-NMR (CDCl$_3$), the following signals of 38 hydrogens were detected. δ (ppm)=8.24 (4H), 7.99-7.92 (4H), 7.72-7.58 (7H), 7.50-7.12 (23H)

[Chem. 14]

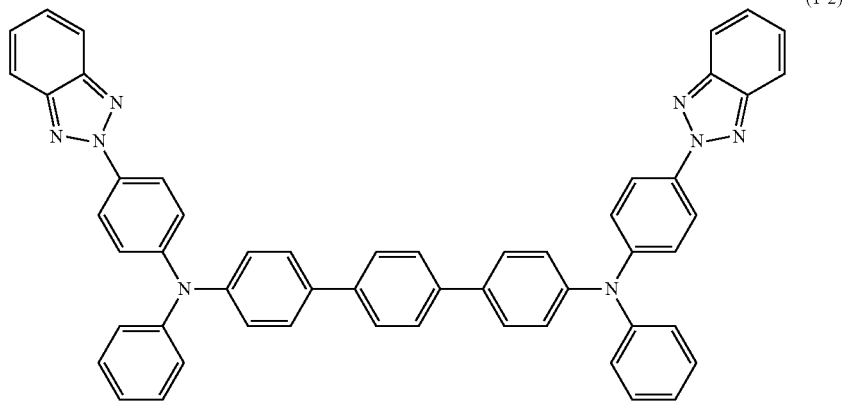

(1-2)

Example 3

Synthesis of N,N'-bis{4-(benzoxazole-2-yl)phenyl}-N,N'-diphenyl-4,4"-diamino-1,1':4',1"-terphenyl (Compound 1-22))

The reaction was caused to occur under similar conditions to those of Example 3, except that {4-(benzoxazole-2-yl)phenyl}phenylamine was used instead of {4-(2H-benzo[1,2,3]triazole-2-yl)phenyl}phenylamine, and thus 12.4 g (with a yield of 47%) of a yellow powder of N,N'-bis{4-(benzoxazole-2-yl)phenyl}-N,N'-diphenyl-4,4"-diamino-1,1':4',1"-terphenyl (Compound (1-22)) was obtained.

The structure of the obtained yellow powder was identified using NMR.

In $^1$H-NMR (CDCl$_3$), the following signals of 38 hydrogens were detected. δ (ppm)=8.13 (4H), 7.80-7.55 (11H), 7.50-7.16 (23H)

[Chem. 15]

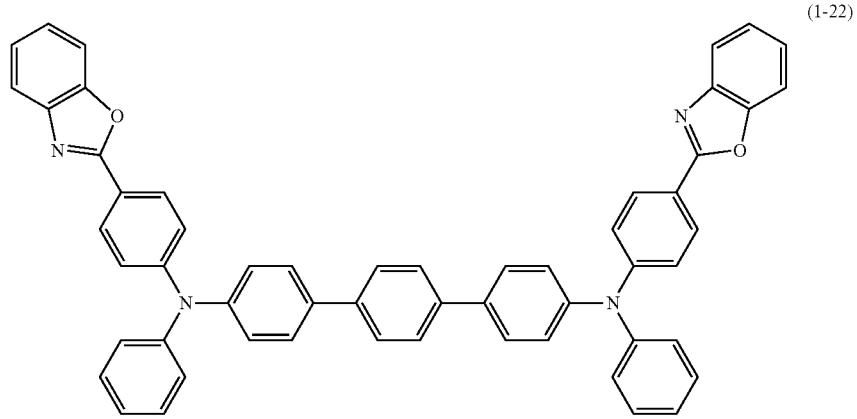

(1-22)

Example 4

Synthesis of N,N'-bis {4-(benzoxazole-2-yl)phenyl}-N,N'-diphenyl-4,4'-diamino-1,1'-biphenyl (Compound 1-23))

The reaction was caused to occur under similar conditions to those of Example 1, except that 2-(4-bromophenyl)-benzoxazole was used instead of 2-(4-bromophenyl)-2H-benzo[1,2,3]triazole, and thus 8.8 g (with a yield of 54%) of a pale yellow powder of N,N'-bis {4-(benzoxazole-2-yl)phenyl}-N,N'-diphenyl-4,4'-diamino-1,1'-biphenyl (Compound (1-23)) was obtained.

The structure of the obtained pale yellow powder was identified using NMR.

In $^1$H-NMR (CDCl$_3$), the following signals of 34 hydrogens were detected. δ (ppm)=8.12 (4H) 7.80-7.72 (2H) 7.60-7.53 (5H) 7.41-7.14 (23H)

[Chem. 16]

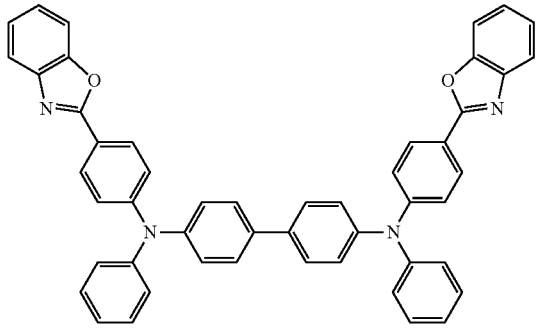

(1-23)

Example 5

Synthesis of N,N'-bis{4-(benzothiazole-2-yl)phenyl}-N,N'-diphenyl-4,4'-diamino-1,1'-biphenyl (Compound 1-25))

The reaction was caused to occur under similar conditions to those of Example 1, except that 2-(4-bromophenyl)-benzothiazole was used instead of 2-(4-bromophenyl)-2H-benzo[1,2,3]triazole, and thus 9.3 g (with a yield of 62%) of a pale yellow powder of N,N'-bis{4-(benzothiazole-2-yl)phenyl}-N,N'-diphenyl-4,4'-diamino-1,1'-biphenyl (Compound (1-25)) was obtained.

The structure of the obtained pale yellow powder was identified using NMR.

In $^1$H-NMR (CDCl$_3$), the following signals of 34 hydrogens were detected. δ (ppm)=8.10-7.88 (8H), 7.60-7.13 (26H)

[Chem. 17]

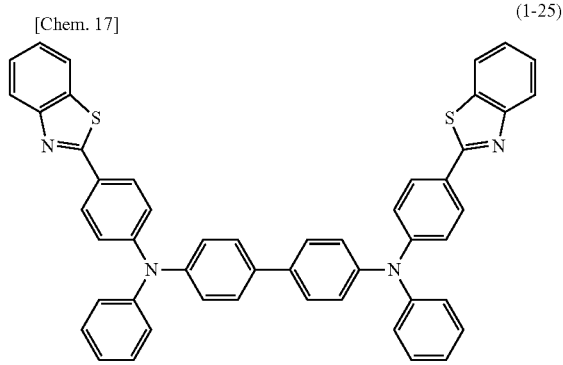

(1-25)

Example 6

Synthesis of N,N'-bis{4-(benzothiazole-2-yl)phenyl}-N,N'-diphenyl-4,4"-diamino-1,1':4',1"-terphenyl (Compound 1-27))

First, 9.3 g of N-{4-(benzothiazole-2-yl)phenyl}phenylamine, 7.1 g of 4,4"-diiodo-1,1':4',1"-terphenyl, 4.6 g of tert-butoxy sodium, and 140 ml of toluene were added to a nitrogen-purged reaction vessel, and a nitrogen gas was passed therethrough under ultrasonic irradiation for 30 minutes. Then, 0.20 g of palladium acetate and 0.5 g of 50% (v/v) toluene solution of tert-butylphosphine were added and heated, and the mixture was heated to reflux with stirring for 3 hours. After cooling to room temperature, a precipitate was taken out through filtration, and then repeatedly purified through crystallization using a mixed solvent of 1,2-dichlorobenzene/methanol, and thus 7.0 g (with a yield of 58%) of a green powder of N,N'-bis{4-(benzothiazole-2-yl)phenyl}-N,N'-diphenyl-4,4"-diamino-1,1':4',1"-terphenyl (Compound (1-27)) was obtained.

The structure of the obtained green powder was identified using NMR.

In $^1$H-NMR (CDCl$_3$), the following signals of 38 hydrogens were detected. δ (ppm)=8.05 (2H), 7.98 (4H), 7.90 (2H), 7.70 (4H), 7.61 (4H), 7.50 (2H), 7.42-7.31 (6H), 7.30-7.11 (14H)

[Chem. 18]

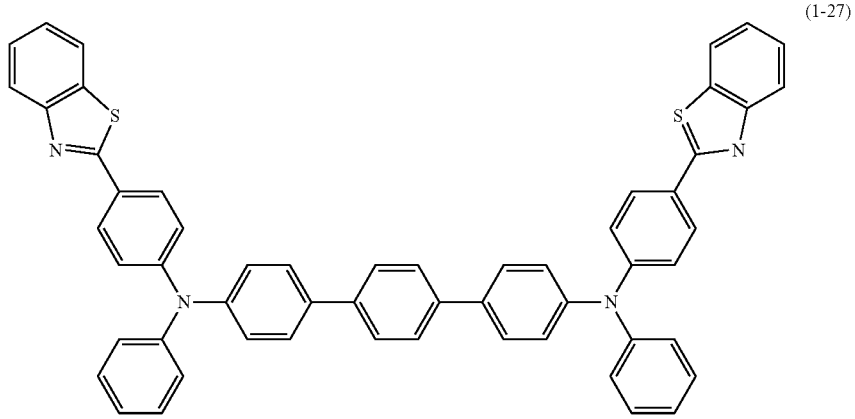

(1-27)

Example 7

The glass transition point of each of the arylamine compounds represented by the general formula (1) was measured using a high-sensitivity differential scanning calorimeter (DSC3100S manufactured by Bruker AXS K.K.). Table 1 shows the results.

TABLE 1

| Compound | Glass transition point |
| --- | --- |
| Compound (1-1) | 125° C. |
| Compound (1-2) | 135° C. |
| Compound (1-22) | 137° C. |
| Compound (1-23) | 128° C. |
| Compound (1-25) | 127° C. |
| Compound (1-27) | 137° C. |

The arylamine compounds represented by the general formula (1) had a glass transition point of 100° C. or higher, which indicates that these compounds are stable in a thin film state.

Example 8

A vapor-deposited film with a film thickness of 80 nm was formed on a silicon substrate using each of the arylamine compounds represented by the general formula (1) above, and a refractive index n was measured using a spectroscopic measurement device (F10-RT-UV manufactured by Filmetrics). For comparison, the measurement was also performed on $Alq_3$ and Comparative Compounds (2-1) and (2-2) having the structural formulae as below. Table 2 collectively shows the measurement results.

[Chem. 19]

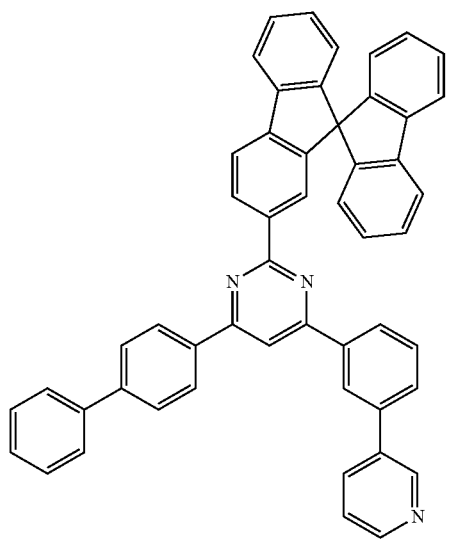

(2 1)

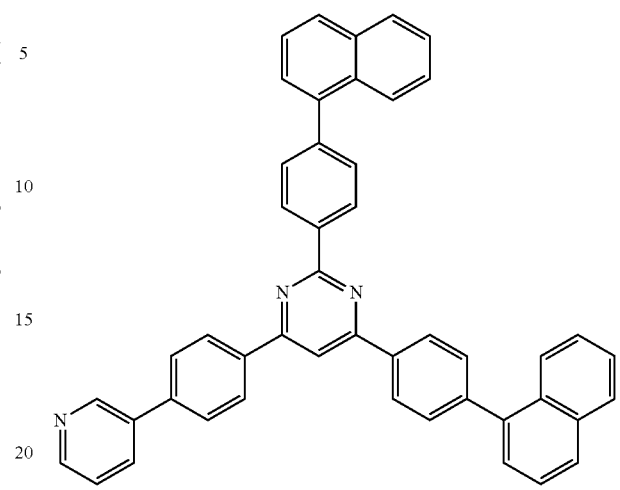

(2 2)

TABLE 2

| | Refractive index n (λ: 450 nm) | Refractive index n (λ: 460 nm) | Refractive index n (λ: 550 nm) | Refractive index n (λ: 750 nm) |
| --- | --- | --- | --- | --- |
| Example Compound (1-1) | 2.28 | 2.20 | 1.96 | 1.87 |
| Example Compound (1-2) | 2.25 | 2.18 | 1.95 | 1.86 |
| Example Compound (1-22) | 2.21 | 2.15 | 1.95 | 1.87 |
| Example Compound (1-23) | 2.25 | 2.19 | 1.99 | 1.88 |
| Example Compound (1-25) | 2.31 | 2.23 | 1.98 | 1.89 |
| Example Compound (1-27) | 2.28 | 2.20 | 1.97 | 1.87 |
| $Alq_3$ | 1.88 | 1.86 | 1.78 | 1.73 |
| Comparative Compound (2-1) | 1.80 | 1.79 | 1.74 | 1.70 |
| Comparative Compound (2-2) | 1.93 | 1.92 | 1.86 | 1.81 |

In this manner, the arylamine compounds represented by the general formula (1) had refractive indices that were higher than those of $Alq_3$ and Comparative Compounds (2-1) and (2-2). Furthermore, Comparative Compound (2-1) had refractive indices that were lower than those of $Alq_3$, which indicates that the general formula (I) above is satisfied.

Example 9

The element structure of Example 11 below was subjected to an optical property simulation using $Alq_3$ for the first capping layer and the Compound (1-22) for the second capping layer, according to the Semiconducting Emissive Thin Film Optics Simulation (Setfos 3.2) program. In order to check the correlation between the refractive indices of the electron transport layer and the first capping layer, after the refractive index of the first capping layer was fixed, the refractive index of the electron transport layer and the conversion efficiency at a peak wavelength of 460 nm of a blue light emitting dopant were calculated for each of Compounds (2-1) and (2-2), and Compounds A to E with different refractive indices. Table 3 collectively shows the calculation results.

TABLE 3

| Electron transport layer | Refractive index (λ: 460 nm) | Light emission efficiency [cd/A] | Chromaticity coordinate [CIEy] | Conversion efficiency [cd/A/CIEy] |
| --- | --- | --- | --- | --- |
| Compound (2-1) | 1.79 | 7.00 | 0.042 | 168 |
| Compound A | 1.81 | 7.07 | 0.042 | 167 |
| Compound B | 1.88 | 7.16 | 0.044 | 162 |
| Compound (2-2) | 1.92 | 7.22 | 0.045 | 160 |
| Compound C | 1.98 | 7.29 | 0.047 | 155 |
| Compound D | 2.00 | 7.31 | 0.048 | 152 |
| Compound E | 2.10 | 7.28 | 0.051 | 142 |

In this manner, electron transport layers with low refractive indices at a wavelength of 460 nm had large conversion efficiencies, which indicates that the light extraction efficiency is improved by using an electron transport layer with a low refractive index.

Example 10

As shown in FIG. 1, an organic EL element was prepared by forming a reflecting ITO electrode serving as a metal anode 2 on a glass substrate 1 in advance, and furthermore, vapor-depositing a hole injection layer 3, a hole transport layer 4, a light emitting layer 5, an electron transport layer 6, an electron injection layer 7, a cathode 8, a first capping layer 9, and a second capping layer 10 in this order on the ITO electrode.

Specifically, a glass substrate 1 on which an ITO film with a thickness of 50 nm, a reflecting film of silver alloy with a film thickness of 100 nm, and an ITO film with a thickness of 5 nm were formed in this order was ultrasonically cleaned in isopropyl alcohol for 20 minutes, and then dried for 10 minutes on a hot plate heated to 250° C. After that, UV/ozone treatment was performed for 2 minutes. Then, the glass substrate with ITO was attached inside a vacuum vapor deposition machine, and the pressure was reduced to 0.001 Pa or less. Subsequently, an electron acceptor (Acceptor-1) having the structural formula as below and Compound (3-1) having the structural formula as below were vapor-deposited so as to cover the transparent anode 2 through binary vapor deposition at such vapor deposition rates that the ratio of the vapor deposition rate of (Acceptor-1) to the vapor deposition rate of Compound (3-1) was 3:97, and a film with a thickness of 10 nm was thus formed as a hole injection layer 3.

A film of Compound (3-1) having the structural formula as below was formed on the hole injection layer 3 as a hole transport layer 4 with a film thickness of 140 nm.

Compound (EMD-1) having the structural formula as below and Compound (EMH-1) having the structural formula as below were vapor-deposited on the hole transport layer 4 through binary vapor deposition at such vapor deposition rates that the ratio of the vapor deposition rate of (EMD-1) to the vapor deposition rate of (EMH-1) was 5:95, and a film with a thickness of 20 nm was thus formed as a light emitting layer 5.

Compound (2-1) having the structural formula as below and Compound (ETM-1) having the structural formula as below were vapor-deposited on the light emitting layer 5 through binary vapor deposition at such vapor deposition rates that the ratio of the vapor deposition rate of (2-1) to the vapor deposition rate of (ETM-1) was 50:50, and a film with a thickness of 30 nm was thus formed as an electron transport layer 6.

A film of lithium fluoride was formed on the electron transport layer 6, as an electron injection layer 7 with a film thickness of 1 nm.

A film of magnesium-silver alloy was formed on the electron injection layer 7, as a cathode 8 with a film thickness of 12 nm.

A film of Alq₃ was formed on the cathode 8, as a first capping layer 9 with a film thickness of 30 nm, and, finally, a film of Compound (1-1) of Example 3 was formed as a second capping layer 10 with a film thickness of 30 nm.

The properties of the prepared organic EL element were measured in the atmosphere at normal temperature. Table 4 collectively shows the measurement results of light emission properties that were obtained when a DC voltage was applied to the prepared organic EL element.

[Chem. 20]

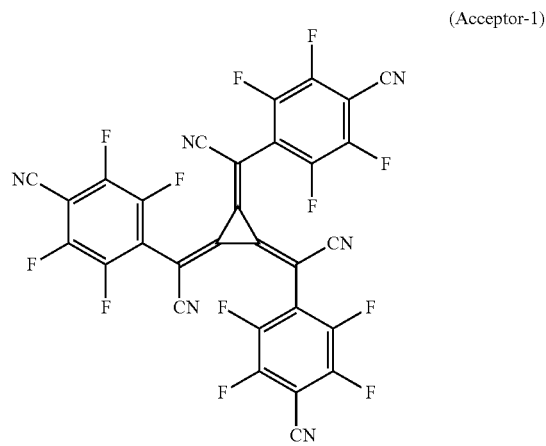

(Acceptor-1)

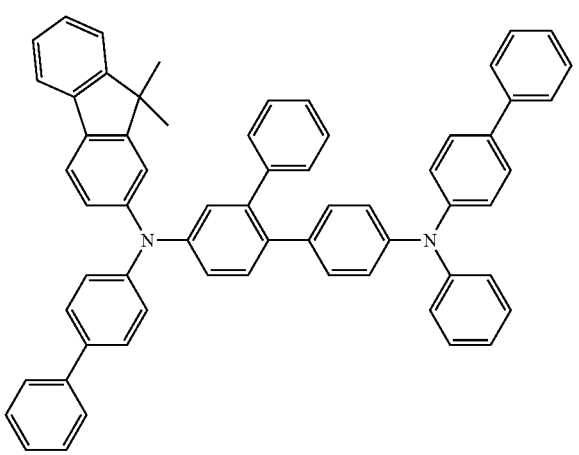

(3-1)

(EMD-1)

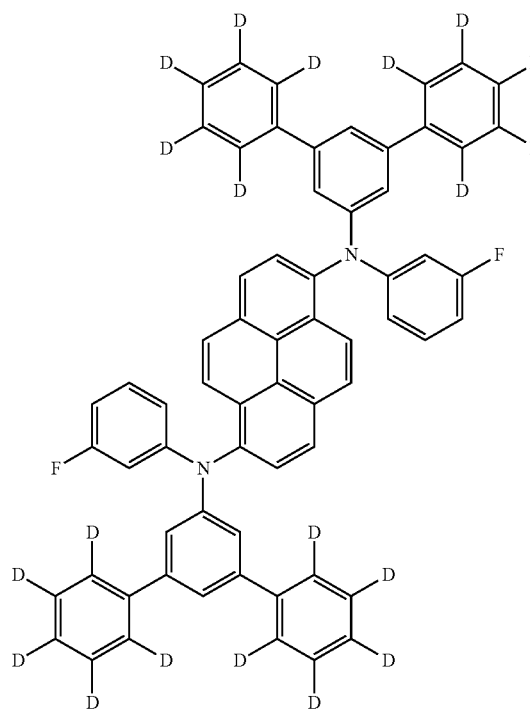

(EMH-1)

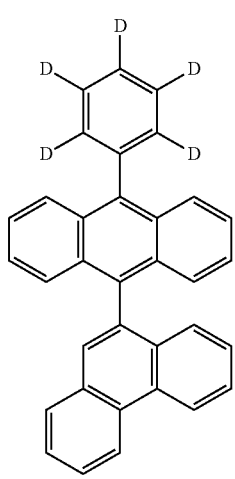

(2-1)

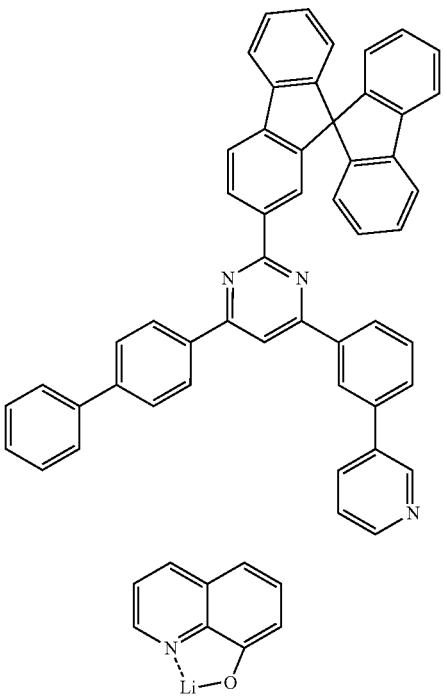

(ETM-1)

Example 11

An organic EL element was prepared under similar conditions to those of Example 10, except that, instead of Compound (1-1) of Example 1, Compound (1-2) of Example 2 was used to form a film with a thickness of 30 nm as the second capping layer 10. The properties of the prepared organic EL element were measured in the atmosphere at normal temperature. Table 3 collectively shows the measurement results of light emission properties that were obtained when a DC voltage was applied to the prepared organic EL element.

Example 12

An organic EL element was prepared under similar conditions to those of Example 10, except that, instead of Compound (1-1) of Example 1, Compound (1-22) of Example 3 was used to form a film with a thickness of 30 nm as the second capping layer 10. The properties of the prepared organic EL element were measured in the atmosphere at normal temperature. Table 3 collectively shows the measurement results of light emission properties that were obtained when a DC voltage was applied to the prepared organic EL element.

Example 13

An organic EL element was prepared under similar conditions to those of Example 10, except that, instead of Compound (1-1) of Example 1, Compound (1-23) of Example 4 was used to form a film with a thickness of 30 nm as the second capping layer 10. The properties of the prepared organic EL element were measured in the atmosphere at normal temperature. Table 3 collectively shows the measurement results of light emission properties that were obtained when a DC voltage was applied to the prepared organic EL element.

Example 14

An organic EL element was prepared under similar conditions to those of Example 10, except that, instead of Compound (1-1) of Example 1, Compound (1-25) of Example 5 was used to form a film with a thickness of 30 nm as the second capping layer 10. The properties of the prepared organic EL element were measured in the atmosphere at normal temperature. Table 3 collectively shows the measurement results of light emission properties that were obtained when a DC voltage was applied to the prepared organic EL element.

Example 15

An organic EL element was prepared under similar conditions to those of Example 10, except that, instead of Compound (1-1) of Example 1, Compound (1-27) of Example 6 was used to form a film with a thickness of 30 nm as the second capping layer 10. The properties of the prepared organic EL element were measured in the atmosphere at normal temperature. Table 3 collectively shows the measurement results of light emission properties that were obtained when a DC voltage was applied to the prepared organic EL element.

Comparative Example 1

For comparison, an organic EL element was prepared under similar conditions to those of Example 10, except that Alq$_3$ was used to form a film with a thickness of 60 nm as the first capping layer 9, and the second capping layer 10 was not provided. The properties of the prepared organic EL element were measured in the atmosphere at normal temperature. Table 3 collectively shows the measurement results of light emission properties that were obtained when a DC voltage was applied to the prepared organic EL element.

Comparative Example 2

For comparison, an organic EL element was prepared under similar conditions to those of Example 12, except that, instead of Compound (2-1), Alq$_3$ was used for the electron transport layer 6. The properties of the prepared organic EL element were measured in the atmosphere at normal temperature. Table 3 collectively shows the measurement results of light emission properties that were obtained when a DC voltage was applied to the prepared organic EL element.

Comparative Example 3

For comparison, an organic EL element was prepared under similar conditions to those of Example 12, except that, instead of Compound (2-1), Compound (2-2) was used for the electron transport layer 6. The properties of the prepared organic EL element were measured in the atmosphere at normal temperature. Table 3 collectively shows the measurement results of light emission properties that were obtained when a DC voltage was applied to the prepared organic EL element.

With use of the organic EL elements prepared in Examples 10 to 15 and Comparative Examples 1 to 3, the element lifespan was measured. Table 3 collectively shows the results. The element lifespan was defined as follows: when constant current driving was performed at 10 mA/cm$^2$ with the initial luminance being set to 100%, the time taken for the luminance to decay to 95% was measured as the element lifespan.

TABLE 4

| | Electron transport layer | First capping layer | Second capping layer | Voltage [V] (@10 mA/cm$^2$) | Luminance [cd/m$^2$] (@10 mA/cm$^2$) | Light emission efficiency [cd/A] | Power efficiency [lm/W] | Chromaticity coordinate [CIEy] | Conversion efficiency [cd/A/CIEy] | Element lifespan at decay of 95% |
|---|---|---|---|---|---|---|---|---|---|---|
| Ex. 10 | Compound (2-1) | Alq$_3$ | Example Compound (1-1) | 3.63 | 824 | 8.24 | 7.14 | 0.046 | 179.20 | 176 hours |
| Ex. 11 | Compound (2-1) | Alq$_3$ | Example Compound (1-2) | 3.63 | 834 | 8.33 | 7.21 | 0.047 | 177.30 | 171 hours |
| Ex. 12 | Compound (2-1) | Alq$_3$ | Example Compound (1-22) | 3.64 | 841 | 8.41 | 7.27 | 0.046 | 182.90 | 186 hours |
| Ex. 13 | Compound (2-1) | Alq$_3$ | Example Compound (1-23) | 3.63 | 826 | 8.25 | 7.15 | 0.045 | 183.40 | 179 hours |
| Ex. 14 | Compound (2-1) | Alq$_3$ | Example Compound (1-25) | 3.64 | 851 | 8.51 | 7.35 | 0.047 | 181.00 | 181 hours |
| Ex. 15 | Compound (2-1) | Alq$_3$ | Example Compound (1-27) | 3.62 | 832 | 8.31 | 7.21 | 0.046 | 180.80 | 177 hours |
| Com. Ex. 1 | Compound (2-1) | Alq$_3$ | — | 3.65 | 714 | 7.14 | 6.15 | 0.047 | 151.87 | 114 hours |
| Com. Ex. 2 | Alq$_3$ | Alq$_3$ | Example Compound (1-22) | 3.83 | 768 | 7.67 | 6.29 | 0.045 | 170.80 | 152 hours |
| Com. Ex. 3 | Compound (2-2) | Alq$_3$ | Example Compound (1-22) | 3.61 | 728 | 7.28 | 6.34 | 0.044 | 165.60 | 129 hours |

As shown in Table 4, while the element of Comparative Example 1 not provided with the second capping layer and the elements of Examples 10 to 15 using the arylamine compounds represented by the general formula (1) as the second capping layer had substantially similar driving voltages at a current density of 10 mA/cm², all of the elements of Examples 10 to 15 achieved an improvement in terms of luminance, light emission efficiency, power efficiency, conversion efficiency, and lifespan. This fact means that the light extraction efficiency can be significantly improved by a stacked structure that includes a second capping layer containing an arylamine compound represented by the general formula (1). Furthermore, among the elements of Comparative Examples 2 and 3 using $Alq_3$ and Compound (2-2) for the electron transport layer and the elements of Examples 10 to 15, all of the elements of Examples 10 to 15 achieved an improvement in terms of luminance, light emission efficiency, power efficiency, conversion efficiency, and lifespan. This fact means that an element having the stacked structure has a significantly improved light extraction efficiency resulting from the refractive index of the electron transport layer being lower than the refractive index of the first capping layer.

INDUSTRIAL APPLICABILITY

As described above, an organic EL element in which an electron transport layer and a first capping layer that satisfy the general formula (I) and a second capping layer that contains an arylamine compound represented by the general formula (1) are stacked has high efficiency. Furthermore, the compound that does not have absorption in blue, green, and red wavelength regions is particularly preferably used to provide a clear and bright image with good color purity. Therefore, the present invention can be applied to uses such as home electric appliances and lighting equipment, for example.

The invention claimed is:

1. An organic electroluminescent element at least comprising an anode, a hole transport layer, a light emitting layer, an electron transport layer, a cathode, and a capping layer arranged in this order, wherein
the capping layer has a structure constituted by two layers consisting of a first capping layer and a second capping layer that are arranged in this order from the cathode side,
a refractive index of the second capping layer is higher than a refractive index of the first capping layer throughout a wavelength range from 450 to 650 nm, and
the second capping layer contains an arylamine compound represented by the general formula (1) as below:

[Chem. 1]

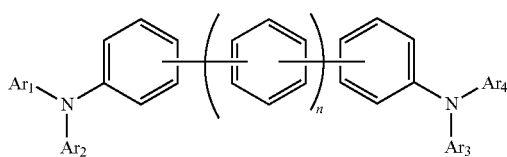

(1)

where $Ar_1$, $Ar_2$, $Ar_3$, and $Ar_4$ are optionally the same or different, and represent a substituted or unsubstituted aromatic hydrocarbon group, a substituted or unsubstituted aromatic heterocyclic group, or a substituted or unsubstituted fused polycyclic aromatic group,
at least one of $Ar_1$, $Ar_2$, $Ar_3$, and $Ar_4$ is a monovalent group represented by the structural formula (B) as below, or a group substituted with the monovalent group represented by the structural formula (B), and
n represents an integer of 0 to 4:

[Chem. 2]

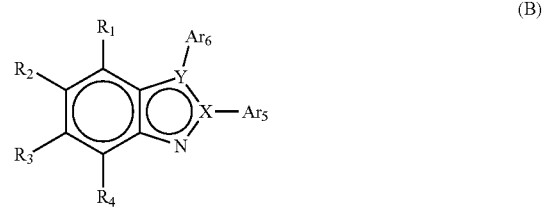

(B)

where $R_1$, $R_2$, $R_3$, and $R_4$ are optionally the same or different, and represent a hydrogen atom, a heavy hydrogen atom, a fluorine atom, a chlorine atom, a cyano group, a nitro group, a silyl group, a linear or branched alkyl group having 1 to 6 carbon atoms and optionally having a substituent, a cycloalkyl group having 5 to 10 carbon atoms and optionally having a substituent, a linear or branched alkenyl group having 2 to 6 carbon atoms and optionally having a substituent, a linear or branched alkyloxy group having 1 to 6 carbon atoms and optionally having a substituent, a cycloalkyloxy group having 5 to 10 carbon atoms and optionally having a substituent, a substituted or unsubstituted aromatic hydrocarbon group, a substituted or unsubstituted aromatic heterocyclic group, a substituted or unsubstituted fused polycyclic aromatic group, or a substituted or unsubstituted aryloxy group,
$R_1$, $R_2$, $R_3$, and $R_4$ are optionally bonded to each other to form a ring via a single bond, a substituted or unsubstituted methylene group, a substituted or unsubstituted amino group, an oxygen atom, or a sulfur atom,
$Ar_5$ and $Ar_6$ are optionally the same or different, and represent a substituted or unsubstituted aromatic hydrocarbon group, a substituted or unsubstituted aromatic heterocyclic group, or a substituted or unsubstituted fused polycyclic aromatic group,
at least one of $R_1$, $R_2$, $R_3$, $R_4$, $Ar_5$, and $Ar_6$ is a linking group as a binding site,
X represents a carbon atom or a nitrogen atom,
Y represents a carbon atom, a nitrogen atom, an oxygen atom, or a sulfur atom,
in a case in which Y is an oxygen atom or a sulfur atom, Y has no $Ar_6$,
in a case in which X and Y are a nitrogen atom, X or Y has no $Ar_5$ nor $Ar_6$,
in a case in which X is a nitrogen atom and Y is a carbon atom, X or Y has no $Ar_5$ nor $Ar_6$, and
there is no case in which X and Y are a carbon atom, no case in which X is a nitrogen atom and Y is an oxygen atom, and no case in which X is a nitrogen atom and Y is a sulfur atom, and
wherein a refractive index ($n_2$) of the electron transport layer and a refractive index ($n_1$) of the first capping layer satisfy the general formula (I) as below throughout a wavelength range from 450 to 550 nm:

$0.005 \leq n_1 - n_2 \leq 0.15$ (I),

2. The organic electroluminescent element according to claim 1, wherein the structural formula (B) above is a monovalent group represented by the structural formula (B-1) as below:

[Chem. 3]

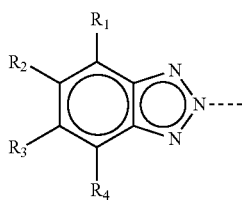

(B-1)

where $R_1$, $R_2$, $R_3$, and $R_4$ are optionally the same or different, and represent a hydrogen atom, a heavy hydrogen atom, a fluorine atom, a chlorine atom, a cyano group, a nitro group, a silyl group, a linear or branched alkyl group having 1 to 6 carbon atoms and optionally having a substituent, a cycloalkyl group having 5 to 10 carbon atoms and optionally having a substituent, a linear or branched alkenyl group having 2 to 6 carbon atoms and optionally having a substituent, a linear or branched alkyloxy group having 1 to 6 carbon atoms and optionally having a substituent, a cycloalkyloxy group having 5 to 10 carbon atoms and optionally having a substituent, a substituted or unsubstituted aromatic hydrocarbon group, a substituted or unsubstituted aromatic heterocyclic group, a substituted or unsubstituted fused polycyclic aromatic group, or a substituted or unsubstituted aryloxy group, $R_1$, $R_2$, $R_3$, and $R_4$ are optionally bonded to each other to form a ring via a single bond, a substituted or unsubstituted methylene group, a substituted or unsubstituted amino group, an oxygen atom, or a sulfur atom, and the broken line portion indicates a binding site.

3. The organic electroluminescent element according to claim 1, wherein the structural formula (B) above is a monovalent group represented by the structural formula (B-2) as below:

[Chem. 4]

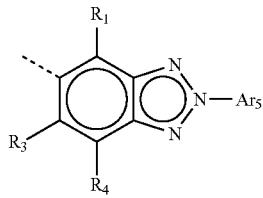

(B-2)

where $R_1$, $R_3$, and $R_4$ are the same as $R_1$, $R_3$, and $R_4$ in the general formula (B-1) above, $R_3$ and $R_4$ are optionally bonded to each other to form a ring via a single bond, a substituted or unsubstituted methylene group, a substituted or unsubstituted amino group, an oxygen atom, or a sulfur atom, $Ar_5$ represents a substituted or unsubstituted aromatic hydrocarbon group, a substituted or unsubstituted aromatic heterocyclic group, or a substituted or unsubstituted fused polycyclic aromatic group, and the broken line portion indicates a binding site.

4. The organic electroluminescent element according to claim 1, wherein the structural formula (B) above is a monovalent group represented by the structural formula (B-3) as below:

[Chem. 5]

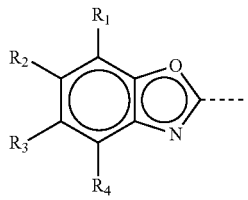

(B-3)

where $R_1$, $R_2$, $R_3$, and $R_4$ are the same as $R_1$, $R_2$, $R_3$, and $R_4$ in the general formula (B-1) above, and the broken line portion indicates a binding site.

5. The organic electroluminescent element according to claim 1, wherein the structural formula (B) above is a monovalent group represented by the structural formula (B-4) as below:

[Chem. 6]

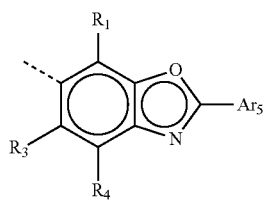

(B-4)

where $R_1$, $R_3$, and $R_4$ are the same as $R_1$, $R_3$, and $R_4$ in the general formula (B-1) above, $R_3$ and $R_4$ are optionally bonded to the same substituted benzene ring to form a ring via a single bond, a substituted or unsubstituted methylene group, a substituted or unsubstituted amino group, an oxygen atom, or a sulfur atom, $Ar_5$ represents a substituted or unsubstituted aromatic hydrocarbon group, a substituted or unsubstituted aromatic heterocyclic group, or a substituted or unsubstituted fused polycyclic aromatic group, and the broken line portion indicates a binding site.

6. The organic electroluminescent element according to claim 1, wherein the structural formula (B) above is a monovalent group represented by the structural formula (B-5) as below:

[Chem. 7]

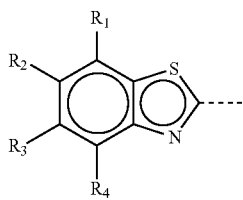

(B-5)

where $R_1$, $R_2$, $R_3$, and $R_4$ are the same as $R_1$, $R_2$, $R_3$, and $R_4$ in the general formula (B-1) above, and
the broken line portion indicates a binding site.

7. The organic electroluminescent element according to claim 1, wherein the structural formula (B) above is a monovalent group represented by the structural formula (B') as below:

[Chem. 8]

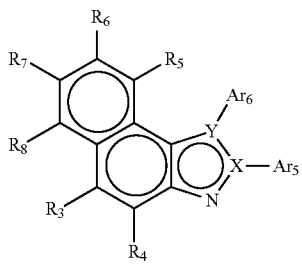

(B')

where $R_3$, $R_4$, $R_5$, $R_6$, $R_7$, and $R_8$ are optionally the same or different, and represent a hydrogen atom, a heavy hydrogen atom, a fluorine atom, a chlorine atom, a cyano group, a nitro group, a silyl group, a linear or branched alkyl group having 1 to 6 carbon atoms and optionally having a substituent, a cycloalkyl group having 5 to 10 carbon atoms and optionally having a substituent, a linear or branched alkenyl group having 2 to 6 carbon atoms and optionally having a substituent, a linear or branched alkyloxy group having 1 to 6 carbon atoms and optionally having a substituent, a cycloalkyloxy group having 5 to 10 carbon atoms and optionally having a substituent, a substituted or unsubstituted aromatic hydrocarbon group, a substituted or unsubstituted aromatic heterocyclic group, a substituted or unsubstituted fused polycyclic aromatic group, or a substituted or unsubstituted aryloxy group, $R_3$, $R_4$, $R_5$, $R_6$, $R_7$, and $R_8$ are optionally bonded to each other to form a ring via a single bond, a substituted or unsubstituted methylene group, a substituted or unsubstituted amino group, an oxygen atom, or a sulfur atom, $Ar_5$ and $Ar_6$ are optionally the same or different, and represent a substituted or unsubstituted aromatic hydrocarbon group, a substituted or unsubstituted aromatic heterocyclic group, or a substituted or unsubstituted fused polycyclic aromatic group, at least one of $R_3$, $R_4$, $R_5$, $R_6$, $R_7$, $R_8$, $Ar_5$, and $Ar_6$ is a linking group as a binding site, X represents a carbon atom or a nitrogen atom, Y represents a carbon atom, a nitrogen atom, an oxygen atom, or a sulfur atom, in a case in which Y is an oxygen atom or a sulfur atom, Y has no $Ar_6$, in a case in which X and Y are a nitrogen atom, X or Y has no $Ar_5$ nor $Ar_6$, and there is no case in which X and Y are a carbon atom, no case in which X is a nitrogen atom and Y is an oxygen atom, and no case in which X is a nitrogen atom and Y is a sulfur atom.

8. The organic electroluminescent element according to claim 1, wherein n is 0 in the general formula (1) above.

9. The organic electroluminescent element according to claim 1, wherein n is 1 in the general formula (1) above.

10. The organic electroluminescent element according to claim 1, wherein n is 2 in the general formula (1) above.

11. The organic electroluminescent element according to claim 1, wherein any two of $Ar_1$, $Ar_2$, $Ar_3$, and $Ar_4$ in the general formula (1) above are a monovalent group represented by the structural formula (B) above, or a group substituted with the monovalent group represented by the structural formula (B).

12. The organic electroluminescent element according to claim 1, wherein $Ar_1$ and $Ar_4$ in the general formula (1) above are a monovalent group represented by the structural formula (B) above, or a group substituted with the monovalent group represented by the structural formula (B).

13. The organic electroluminescent element according to claim 1, wherein the total thickness of the first capping layer and the second capping layer is from 30 to 120 nm.

14. The organic electroluminescent element according to claim 1, wherein a refractive index of the second capping layer is 1.85 or more throughout a wavelength range from 450 to 750 nm.

* * * * *